US011227991B2

(12) United States Patent
Seong et al.

(10) Patent No.: US 11,227,991 B2
(45) Date of Patent: Jan. 18, 2022

(54) SEMICONDUCTOR DEVICES

(71) Applicant: SAMSUNG ELECTRONICS CO., LTD., Suwon-si (KR)

(72) Inventors: Dong-Jun Seong, Seongnam-si (KR); Sung-Ho Eun, Seoul (KR); Soon-Oh Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/916,227

(22) Filed: Jun. 30, 2020

(65) Prior Publication Data
US 2020/0335692 A1    Oct. 22, 2020

Related U.S. Application Data

(63) Continuation of application No. 15/438,938, filed on Feb. 22, 2017, now abandoned.

(30) Foreign Application Priority Data

Mar. 18, 2016 (KR) .................. 10-2016-0032749

(51) Int. Cl.
*H01L 45/00* (2006.01)
*H01L 27/24* (2006.01)
*H01L 43/02* (2006.01)
*H01L 43/12* (2006.01)
*H01L 43/08* (2006.01)
*H01L 27/22* (2006.01)

(52) U.S. Cl.
CPC .......... *H01L 45/06* (2013.01); *H01L 27/2409* (2013.01); *H01L 27/2427* (2013.01); *H01L 27/2481* (2013.01); *H01L 43/02* (2013.01); *H01L 43/08* (2013.01); *H01L 43/12* (2013.01); *H01L 45/126* (2013.01); *H01L 45/1233* (2013.01); *H01L 45/1675* (2013.01); *H01L 45/1683* (2013.01); *H01L 27/224* (2013.01); *H01L 45/08* (2013.01); *H01L 45/143* (2013.01); *H01L 45/144* (2013.01); *H01L 45/146* (2013.01)

(58) Field of Classification Search
CPC ....................................... H01L 45/00
See application file for complete search history.

(56) References Cited

U.S. PATENT DOCUMENTS

| 7,995,374 | B2 | 8/2011 | Komura et al. |
| 8,222,075 | B2 | 7/2012 | Ito |
| 8,404,514 | B2 | 3/2013 | Lee et al. |
| 8,507,889 | B2 | 8/2013 | Nagashima |

(Continued)

*Primary Examiner* — Mounir S Amer
(74) *Attorney, Agent, or Firm* — Lee IP Law, P.C.

(57) ABSTRACT

A semiconductor memory device includes first conductive lines extending in a first direction on a substrate, second conductive lines extending in a second direction over the first conductive line, the first and the second conductive lines crossing each other at cross points, a cell structure positioned at each of the cross points, each of the cell structures having a data storage element, a selection element to apply a cell selection signal to the data storage element and to change a data state of the data storage element, and an electrode element having at least an electrode with a contact area smaller than that of the selection element, and an insulation pattern insulating the first and the second conductive lines and the cell structures from one another.

20 Claims, 35 Drawing Sheets

(56) References Cited

U.S. PATENT DOCUMENTS

| | | |
|---|---|---|
| 8,664,631 B2 | 3/2014 | Hirota et al. |
| 8,853,759 B2 | 10/2014 | Lee et al. |
| 2007/0158698 A1 | 7/2007 | Dennison et al. |
| 2013/0134383 A1 | 5/2013 | Hwang et al. |
| 2013/0140515 A1 | 6/2013 | Kawashima et al. |
| 2013/0256624 A1 | 10/2013 | Kau |
| 2015/0028280 A1 | 1/2015 | Sciarrillo et al. |
| 2015/0214478 A1 | 7/2015 | Lee et al. |
| 2015/0243708 A1 | 8/2015 | Ravasio et al. |
| 2016/0181321 A1 | 6/2016 | Jung et al. |
| 2017/0207385 A1 | 7/2017 | Chou et al. |
| 2017/0271580 A1* | 9/2017 | Park .................. H01L 45/143 |

* cited by examiner

SEMICONDUCTOR DEVICES

CROSS-REFERENCE TO RELATED APPLICATIONS

This is a continuation application based on pending application Ser. No. 15/438,938, filed Feb. 22, 2017, the entire contents of which is hereby incorporated by reference. Korean Patent Application No. 10-2016-0032749, filed on Mar. 18, 2016, in the Korean Intellectual Property Office, and entitled: "Semiconductor Memory Devices and Methods of Manufacturing the Same," is incorporated by reference herein in its entirety.

BACKGROUND

1. Field

Example embodiments relate to semiconductor devices and methods of manufacturing semiconductor devices, and more particularly, to non-volatile memory devices having a cross point cell array and methods of manufacturing the same.

2. Description of the Related Art

A flash memory device has an advantage of low manufacturing cost in that the same silicon-based manufacturing processes for dynamic random-access memory (DRAM) devices may be applied to the flash memory manufacturing processes. However, the flash memory device has disadvantages of a relatively lower integration degree and operation speed together with relatively higher power consumption for storing data in comparison with the DRAM devices.

Thus, various next generation nonvolatile memory devices, e.g., a PRAM (phase changeable RAM) device, a MRAM (magnetic RAM) device, and a RRAM (resistive RAM) device, have been suggested so as to overcome the above disadvantages of the flash memory devices. Most of the next generation nonvolatile memory devices have lower power consumption, so a small access time and a large amount of the disadvantages of the nonvolatile memory devices can be solved or alleviated by the next generation nonvolatile memory device.

Particularly, a three-dimensional cross point array structure has been intensively studied in recent times for increasing the integration degree of the nonvolatile memory devices. In the cross point array structure, a plurality of upper electrodes and a plurality of lower electrodes cross each other and a plurality of memory cells is arranged at every cross point of the upper and lower electrodes. Thus, random access can be possible to each of the memory cells of the cross point array structure, and the data programming to each memory cell and the data reading from each memory cell can be individually conducted with high operating efficiency.

A unit cell is provided at a cross point of the upper and lower electrodes and a plurality of the unit cells is vertically stacked, thereby forming the three-dimensional cross point array structure of the next generation nonvolatile memory devices. The three-dimensional cross point array structure can significantly increase the integration degree of the next generation nonvolatile memory device.

SUMMARY

According to exemplary embodiments, there is provided a semiconductor memory device including at least a first conductive line extending in a first direction on a substrate, at least a second conductive line extending in a second direction over the first conductive line such that the first and the second conductive lines may cross each other at each cross point, a plurality of cell structures positioned on each of the cross points of the first and the second conductive lines, each of the cell structures having a data storage element, a selection element that applies a cell selection signal to the data storage element and changes a data state of the data storage element and an electrode element having at least an electrode of which a contact area may be smaller than that of the selection element, and an insulation pattern insulating the first and the second conductive lines and the cell structures with one another.

According to exemplary embodiments, there is provided a semiconductor memory device including a lower conductive line extending in a first direction on a substrate, a middle conductive line extending in a second direction over the lower conductive line such that the lower and the middle conductive lines cross each other at a plurality of first cross points, the middle conductive line having a first component line and a second component line having a width greater than that of the first component line, an upper conductive line extending in the first direction over the middle conductive line such that the middle and the upper conductive lines cross each other at a plurality of second cross points, a plurality of first cell structures positioned on each of the first cross points of the lower conductive line and the first component line, each of the first cell structures having a first data storage element, a first selection element that applies a cell selection signal to the first data storage element and changes a data state of the first data storage element and a lower electrode element having at least an electrode of which a contact area is smaller than that of the first selection element, and a plurality of second cell structures positioned on each of the second cross points of the second component line and the upper conductive line, each of the second cell structures having a second data storage element, a second selection element that applies a cell selection signal to the second data storage element and changes a data state of the second data storage element and an upper electrode element having at least an electrode of which a contact area is smaller than that of the second selection element.

According to exemplary embodiments, there is provided a method of manufacturing the above semiconductor memory device. A plurality of trapezoidal stack lines of lower conductive lines and first cell lines may be formed on a substrate. The stack lines of the lower conductive lines and the first cell lines may extend in a first direction and separated from each other by a first lower insulation pattern. Then, a plurality of first component lines may extend in a second direction and is shaped into a trapezoid in such a way that the first component line may be alternately contact with the first cell line and the first lower insulation pattern and a pair of the first component lines may be spaced apart by a second line trench. The first cell lines may be partially removed in the second trench, thereby forming a plurality of first node separation holes through which the lower conducive line may be exposed and forming a plurality of first cell structures at each cross point of the lower conductive line and the first component line. A second lower insulation pattern may be formed in the first node separation hole and the second line trench, thereby separating the first cell structures and the first component lines from one another. A plurality of trapezoidal stack lines of separation lines, second component lines and second cell lines may be formed on each of the first component lines. The stack lines of the separation lines, the second component lines and the second cell lines may extend in the second direction and may be separated from each other by a second upper insulation pattern. A plurality of upper conductive liens may formed into a trapezoidal shape of line extending in the first direction in such a way that the upper conductive line may be alternately contact with the second cell line and the first second upper insulation pattern and a pair of the upper conductive lines may be spaced apart by a first line trench. The second cell lines exposed in the first trench may be partially removed, thereby forming a plurality of second node separation holes through which the second component line may be exposed and forming a plurality of second cell structures at each cross point of the second component line and the upper conductive line. A first upper insulation pattern may be formed in the second node separation hole and the first line trench, thereby separating the second structures and the upper conductive lines from one another.

According to exemplary embodiments, there is provided a semiconductor memory device including first conductive lines extending in a first direction on a substrate, second conductive lines extending in a second direction over the first conductive line, the first and the second conductive lines crossing each other at cross points, a cell structure positioned at each of the cross points, each of the cell structures having a data storage element, a selection element to apply a cell selection signal to the data storage element and to change a data state of the data storage element, and an electrode element having at least an electrode with a contact area smaller than that of the selection element, and an insulation pattern between adjacent cell structures along each of the first and second direction.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
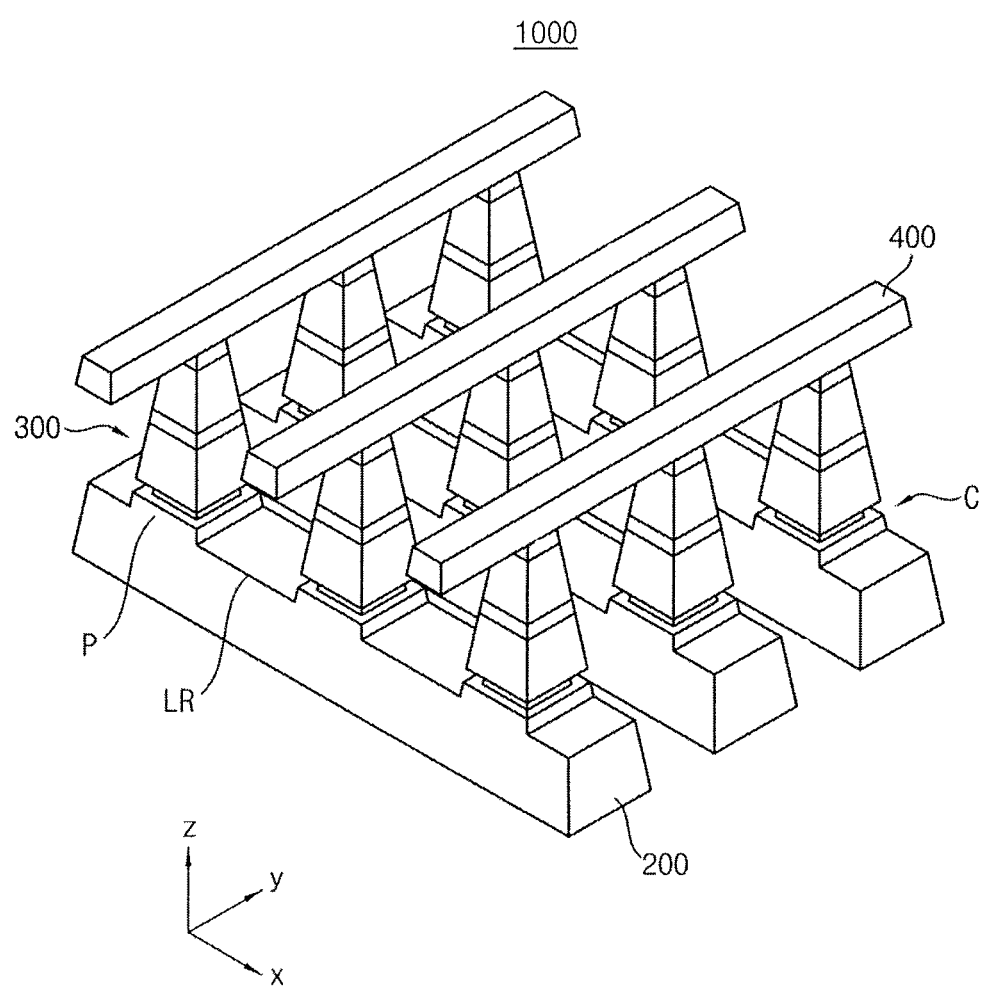
FIG. 1 illustrates a perspective view of a semiconductor memory device according to an embodiment.
Figure 2:
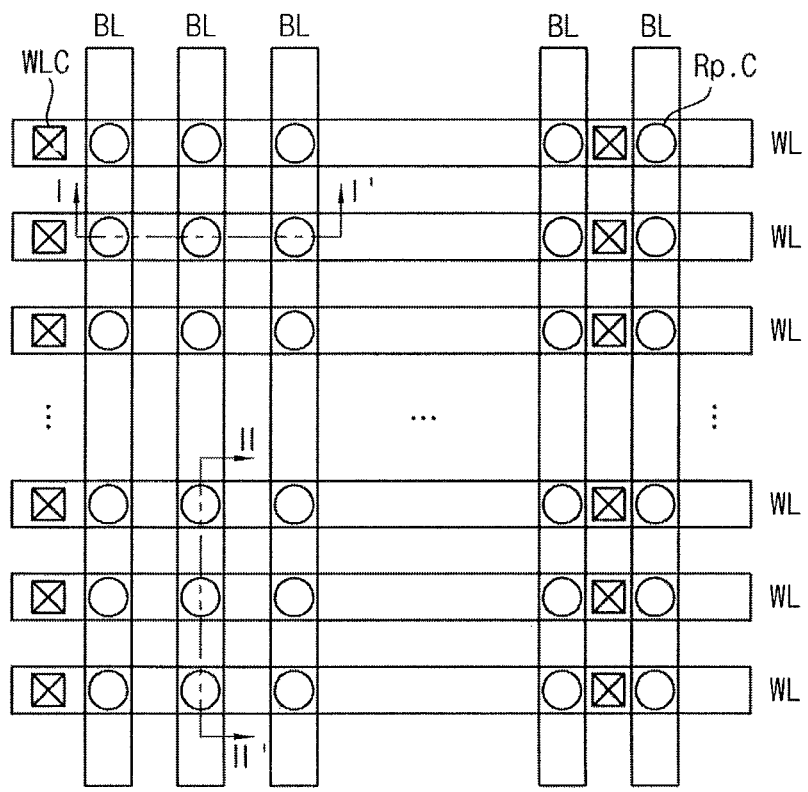
FIG. 2 illustrates a layout of a cell array of the semiconductor memory device in FIG. 1.
Figure 3:
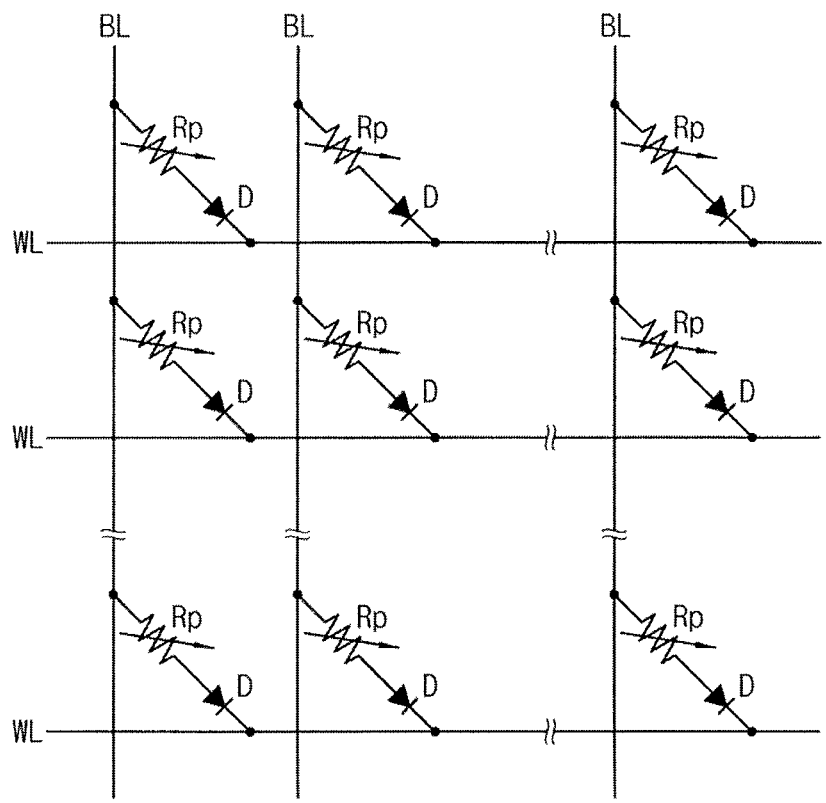
FIG. 3 illustrates an equivalent circuit diagram of the cell array of the semiconductor memory device shown in FIG. 2.
Figure 4A:
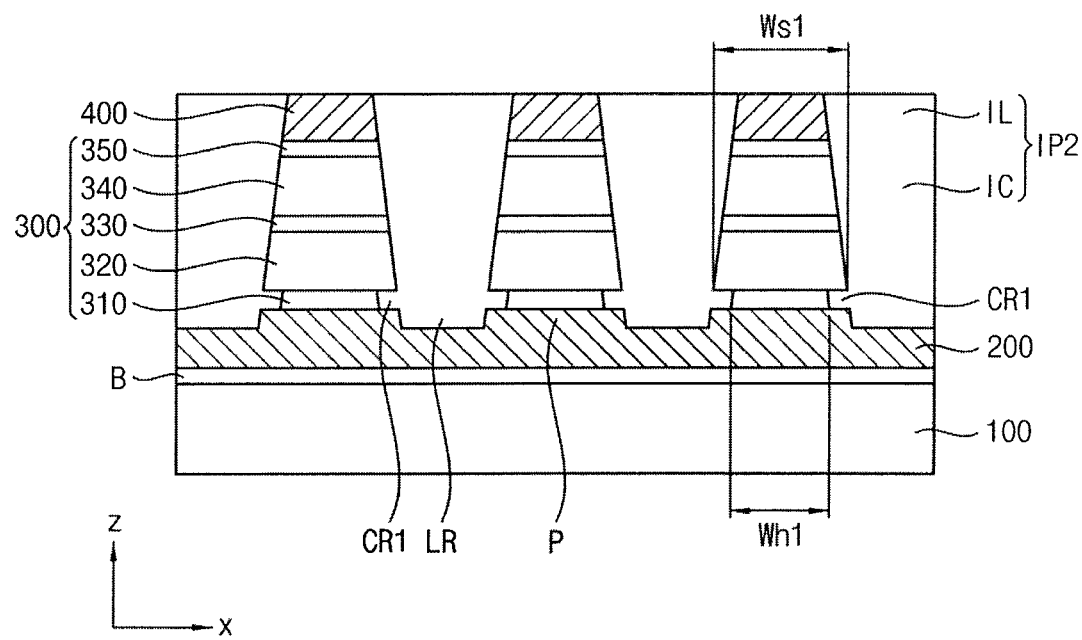
FIG. 4A illustrates a cross-sectional view along line I-I' of FIG. 2.
Figure 4B:
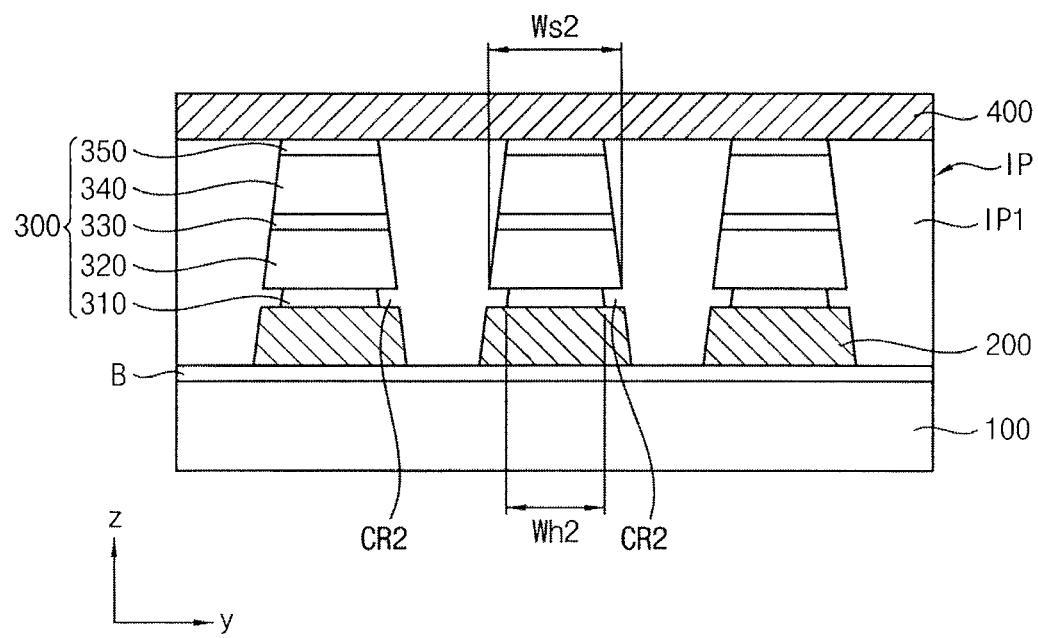
FIG. 4B illustrates a cross-sectional view along line II-II' of FIG. 2.

FIG. 1 is a perspective view illustrating a semiconductor memory device in accordance with an example embodiment. FIG. 2 is a layout illustrating a cell array of the semiconductor memory device in FIG. 1. FIG. 3 is an equivalent circuit diagram illustrating the cell array of the semiconductor memory device shown in FIG. 2. FIG. 4A and 4B are cross-sectional along line I-I' and line II-II' of FIG. 2, respectively. It is noted that for convenience, some layers illustrated in detail in FIGS. 4A-4B (e.g., elements IP1 and IP2) are omitted from FIG. 1, for clarity.

Referring to FIGS. 1 to 4B, a semiconductor memory device 1000 may include at least a first conductive line 200 extending in a first direction x on a substrate 100, at least a second conductive line 400 extending in a second direction y over the first conductive line 200 such that the first and the second conductive lines 200 and 400 cross each other at each cross point C, a plurality of cell structures 300 at the cross points C of the first and the second conductive lines 200 and 400, and an insulation pattern IP insulating the first and the second conductive lines 200 and 400 and the cell structures 300 from one another. Each of the cell structures 300 may have a data storage element 340, a selection element 320 that may apply a cell selection signal to the data storage element 340 and change a data state of the data storage element 340, and an electrode element having at least an electrode of which a contact area is smaller than that of the selection element 340. The electrode element may include first to third electrodes 310, 330 and 350 in the present example embodiment.

The first conductive line 200 may extend in the first direction x on the substrate 100, and a plurality of protrusions P and line recesses LR may be alternately arranged on the first conductive line 200. A plurality of the first conductive lines 200 may be spaced apart from each other by a same gap distance in the second direction y. A plurality of the second conductive lines 400 may be arranged over the first conductive lines 200 and may extend in the second direction y having a same gap distance along the first direction x.

The first and the second conductive lines 200 and 400 may be vertically spaced apart in the third direction z and may cross each other at cross points C. The cross points C of the first and the second conductive lines 200 and 400 may be provided at corresponding protrusions P, e.g., each cross point C may be at a corresponding protrusion P. In such a configuration, a cell structure 300 may be provided at every cross point C, thus the semiconductor memory device 1000 may have a cross point cell array structure.

In the present example embodiment, the first and the second conductive lines 200 and 400 may function as a word line or a bit line of the memory device 1000 and may cross each other in a perpendicular direction. When the first conductive line 200 may function as a word line of the memory device 1000, the second conductive line 400 may function as a bit line of the memory device 1000, and vice versa, when the first conductive line 200 may function as a bit line of the memory device 1000, the second conductive line 400 may function as a word line of the memory device 1000. Particularly, the word line in the present example embodiment may be connected to a strapping word line over the bit line via a word line contact (WLC), thereby reducing electrical resistance of the word line.

For example, the substrate 100 may include a semiconductor substrate, e.g., a silicon (Si) substrate, a gallium (Ga)-arsenic (As) substrate and a silicon (Si)-germanium (Ge) substrate and an insulating substrate, e.g., a silicon-on-insulator (SOI) substrate and a germanium-on-insulator (GOI) substrate in which a pair of silicon/germanium layers may be separated by an insulation layer. The substrate 100 may include any other substrates as long as the substrate may include semiconductor characteristics.

A plurality of the first conductive lines 200 may extend in the first direction x and be separated from a neighboring line by a first insulation pattern IP1 (FIG. 4B), which will be described in detail hereinafter, in the second direction y. For example, the first conductive line 200 may include a low-resistive metal that may be formed on an insulating buffer layer B on the substrate 100. Examples of the low-resistive metal may include tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), etc. These may be used alone or in combinations thereof. Otherwise, a semiconductor layer may be formed on the insulating buffer layer B by an epitaxial growth process and some dopants may be implanted onto the semiconductor layer, to thereby form the first conductive line 200 on the substrate 100.

For example, the first conductive line 200 may be recessed between the cross points C, thus the protrusions P and the recesses R may be alternately arranged on the first conductive line 200.

The cell structure 300, e.g., a multilayer structure, may be staked on the protrusion P, and a second insulation pattern IP2 may be positioned on the line recess LR (FIG. 4A) to thereby electrically and thermally separate the cell structures 300 adjacent to each other in the first direction x. Thus, the cell structures 300 may be separated from each other in the first direction x by the second insulation pattern IP2 of which the bottom may be lower than that of the cell structure 300, thereby reducing or minimizing the thermal cross talk between the neighboring cell structures along the first conductive line 200.

In the present example embodiment, the first insulation pattern IP1 may extend to the buffer layer B from the cell structure 300, so that the first conductive line 200 and the cell structure 300 on the first conductive line 200 may be simultaneously separated from neighboring ones by the first insulation pattern IP1. However, the first insulation pattern IP1 may include a base separation line interposed between the neighboring first conductive lines 200 and a cell separation line interposed between the neighboring cell structures 300.

The second conductive line 400 may make contact with a plurality of the cell structures 300 in the second direction y. For example, the first insulation pattern IP1 may have an upper surface that may be coplanar with an upper surface of the cell structure 300 (FIG. 4B) and may extend in the first direction x, thus the second conductive line 400 may, e.g., make, alternate contact with the cell structures 300 and the first insulation pattern IP1 in the second direction y.

Thus, the first conductive line 200 may make contact with a plurality of the cell structures 300 in the first direction x, and the second conductive line 400 may make contact with a plurality of the cell structures 300 in the second direction y. In the present example embodiment, the second conductive line 400 may include the same low-resistive metal as the first conductive line 200. However, the second conductive line 400 may also include a dopant semiconductor layer into which some dopants may be implanted according to the characteristics of the semiconductor memory device 1000.

As illustrated in FIG. 4A, the second insulation pattern IP2 may include an insulation line IL that may be shaped into a line extending in the second direction y and may separate neighboring second conductive lines 400 along the first direction x, and an insulation column IC that may be shaped into a vertical column in the third direction and may separate neighboring cell structures 300 along the first conductive line 200.

The insulation lines IL may be arranged in the second insulation pattern IP2 in the second direction y, e.g., extend continuously along the second direction y to alternate with the second conductive lines 400, thus the second conductive lines 400 adjacent to each other may be separated by the second insulation lines IL. For example, bottom surfaces of the insulation lines IL may be coplanar with bottom surfaces of the second conductive lines 400. The insulation column IC may protrude downward from a lower surface of the insulation line IL toward the first conductive line 200, and may be interposed between neighboring cell structures 300 in the line recess LR. Therefore, the cell structures 300 may be separated by the insulation column IC in the first direction x, and simultaneously separated by the first insulation pattern IP1 in the second direction y, so that each cell structure 300 may be isolated on the protrusion P at each cross point C.

In detail, an upper surface of the insulation column IC may be coplanar with an upper surface of the first insulation pattern IP1, so that the insulation line IL, e.g., in a region between adjacent second conductive lines 440, may alternately contact the first insulation pattern IP1 and the insulation column IC in the second direction y. For example, the insulation line IL and the insulation column IC may be integrally formed into a single insulator by a single process, e.g., in a region overlapping the line recess LR.

For example, the first and the second insulation patterns IP1 and IP2 may include the same insulation materials, so the first and the second conductive lines 200 and 400 and the cell structures 300 therebetween may be node-separated from one another by a single insulator. For example, the first and the second insulation patterns IP1 and IP2 may include one of silicon oxide, silicon nitride, and silicon oxynitride.

The cell structure 300 may include a multilayer structure that may be stacked on the cross point C of a word line and a bit line of the memory device 1000. The cell structure 300 may include at least a variable resistor Rp for storing electric data between first and the second conductive lines 200 and 400, a switching device D for applying a cell selection signal to the variable resistor Rp, and a plurality of electrodes electrically connected with the variable resistor Rp and the switching device D.

The electrical resistance or crystal state of the variable resistor Rp may be reversibly changed in response to an applied signal such as an electrical signal of a voltage or a current, an optical signal and an electromagnetic wave. The reversible change of the variable resistor Rp may be used as bit information of a unit cell of the memory device 1000. The switching device D may selectively apply the cell selection signal to the variable resistor Rp in such a way that the electrical resistance or crystal state of each variable resistor Rp may be individually changed by the unit cell of the memory device 1000.

For example, the semiconductor memory device 1000 may include a next generation non-volatile memory device, e.g., a phase changeable random access memory (PRAM) device, a resistive random access memory (RRAM) device and a magnetic random access memory (MRAM) device.

In the present example embodiment, the cell structure 300 may include the unit cell of the PRAM device and may include the data storage element 340 for storing a bit data as a material phase, a selection element 320 for individually controlling the material phase of each data storage element 340, and a plurality of electrodes 310, 330 and 350 one of which may have a contact area smaller than that of the selection element 320.

The electrode element may include a first electrode 310 for generating a heat as a heater, a second electrode 330 transferring the selection signal to the data storage element 340 from the selection element 320, and a third electrode 350 functioning as a contact plug. In the present example embodiment, the second electrode 330 may be interposed between the selection element 320 and the data storage element 340 and may include a barrier metal layer for preventing the material diffusion therebetween.

Examples of the material for the first electrode 310 may include tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), etc. These may be used alone or in combinations thereof. The first electrode 310 may generate Joule's heat in response to an electrical current that may be applied to the cell structure 300 and the material state of the data storage element 340 may be changed by the Joule's heat.

The selection element 320 may control the electrical current passing to the data storage element 340 according to a voltage of the word line WL. For example, the selection element 320 may include one of a vertical PN junction diode, a shottky diode and an ovonic threshold switch (OTS). Otherwise, the selection element 340 may also include a selection transistor.

Examples of the materials for the OTS may include arsenic (As), germanium (Ge), selenium (Se), tellurium (Te), silicon (Si), bismuth (Bi), sodium (S), antimony (Sb), etc. These may be used alone or in combinations thereof. In the present example embodiment, the OTS may include a 6-element material in such a material that selenium (Se) and sodium (S) may be combined with a compound of germanium (Ge), silicon (Si), arsenic (As) and tellurium (Te).

Particularly, the OTS may include AsTeGeSiIn, GeTe, SnTe, GeSe, SnSe, AsTeGeSiSbS, AsTeGeSiIP, AsTeGeSi, As2Te3Ge, As2Se3Ge, As25(Te90Ge10)75, Te40As35Si18Ge6.75In0.25, Te28As34.5Ge15.5S22, Te39As36Si17Ge7P, As10Te21S2Ge15Se50Sb2, Si5Te34As28Ge11S21Se1, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, GexSe1-x, etc. These may be used alone or in combinations thereof.

The second electrode 330 may be interposed between the selection element 320 and the data storage element 340, and may reduce the contact resistance at a boundary area between the selection element 320 and the data storage element 340 together with reducing or minimizing the metal diffusion therebetween. Thus, the cell selection signal may be easily transferred to the data storage element 340 from the selection element 320. For example, the second electrode 330 may include a silicide of the metal for the OTS or for the phase changeable material of the data storage element 340.

The data storage element 340 may include a phase changeable material, e.g., chalcogenide and a super lattice. Examples of the chalcogenide may include Ge—Sb—Te, Ge—Te—As, Sn—Te—Sn, Ge—Te, Sb—Te, Se—Te—Sn, Ge—Te—Se, Sb—Se—Bi, Ge—Bi—Te, Ge—Te—Ti, In—Se, Ga—Te—Se, In—Sb—Te, Bi—Sb—Te, etc. These may be used alone or in combinations thereof. The super lattice may include, e.g., an alloy of Ge—Te and Sb—Te.

In a modified example embodiment, the data storage element 340 may include a perovskite-based material or a metal oxide of a transitional metal. In such a case, the cell structure 300 may be provided as a unit cell for a resistive random access memory (RRAM) device. Examples of the perovskite-based material may include titanium oxide (TiO), zirconium oxide (ZrO), aluminum oxide (AlO), hafnium oxide (HfO), tantalum oxide (TaO), niobium oxide (NbO), cobalt oxide (CoO), tungsten oxide WOx, lanthanum oxide (LaO), zinc oxide (ZnO), etc. These may be used alone or in combinations thereof.

In another modified example embodiment, the data storage element 340 may include a material of which the resistance may be varied by a magnetic force or a spin transfer torque (STT). In such a case, the cell structure 300 may be provided as a unit cell for a magnetic random access memory (MRAM) device. For example, the data storage element 340 may include ferromagnetic materials such as iron (Fe), nickel (Ni), cobalt (Co), dysprosium (Dy) and gadolinium (Gd).

The third electrode 350 may be selectively provided with the cell structure 300 and may function as a contact plug for connecting with the first or the second conductive line 200 or 400. For example, the third electrode 350 may include a low-resistive metal or a metal silicide having a low specific resistance. For example, the third electrode 350 may be provided as a part of the cell structure 300 at every cross point C or may be provided as a part of the second conductive line 400.

Particularly, the cell structure 300 may be shaped into a trapezoid in which a width of the cell structure 300 may decrease upward from the first conductive line 200 to the second conductive line 400. In the present example embodiment, the cell structure 300 may include a multilayer structure in which the first electrode 310, the selection element 320, the second electrode 330, the data storage element 340, and the third electrode 350 may be sequentially stacked on the first conductive line 200 in the trapezoidal shape. In such a case, the first electrode 310 may have a contact area smaller than the lower surface of the selection element 320.

For example, the first electrode 310 may have a width smaller than that of the selection element 320 along the first and the second directions x and y, thus the cell structure 300 may have first and second cell recesses CR1 and CR2 that may be defined by the side surface of the first electrode, the lower surface of the selection element 320, and an upper surface of the first conductive line 200.

Particularly, a first width Wh1 of the first electrode 310 along the first direction x may be smaller than a first width Ws1 of the selection element 320 along the first direction x (FIG. 4A), so that the first cell recess CR1 may be recessed along the first direction x. The first recess CR1 may be filled with the insulation column IC.

In addition, a second width Wh2 of the first electrode 310 along the second direction y may be smaller than a second width Ws2 of the selection element 320 along the second direction x (FIG. 4B), so that the second cell recess CR2 may be recessed along the second direction x. The second recess CR2 may be filled with the first insulation column IP1.

Therefore, the gap distances between neighboring cell structures 300 may be maximized and may enlarge an insulation space between the neighboring cell structures 300, thereby improving the insulation characteristics of the semiconductor memory device 1000. Thus, although the integration degree may increase and the line width may decrease in the semiconductor memory device 1000, the electrical interference between neighboring cell structures 300 may be sufficiently reduced due to the improvement of the insulation characteristics.

When the width decrease of the first electrode 310 increases the contact resistance, the film characteristics of the selection element 320 may be deteriorated due to the increase of the contact resistance, thereby causing the selection element 320 to be poor at switching the data storage element 340. That is, when the selection element 320 includes an OTS, an amorphous layer in the OTS may be easily deteriorated by the increase of the contact resistance. Thus, the width of the first electrode 310 may be decreased under that condition that the film characteristics of the selection element 320 are not deteriorated.

Therefore, in the present example embodiment, the width of the first electrode 310 may be about ¼ to about ½ times the width of the selection element 320. Accordingly, the contact area of the first electrode 310 may be about 1/16 to about ¼ times the lower surface of the selection element 320. Particularly, the contact area of the first electrode 310 may be about 1/10 to about ¼ times the lower surface of the selection element 320.

When the width of the first electrode 310 is larger than about ½ times the width of the selection element 320, the insulation space may be substantially enlarged between the neighboring cell structures 300. When the width of the first electrode 310 is less than about ¼ times the width of the selection element 320, the selection element 320 may deteriorate due to the increase of the contact resistance. For those reasons, as discussed previously, the width of the first electrode 310 may be about ¼ to about ½ times the width of the selection element 320, thereby improving the insulation characteristics of the cell structure 300 without the deterioration of the selection element 320.

In a modified example embodiment, the first conductive line 200 may further include the line recess LR that may be arranged on the upper surface alternately with the cell structure 300. Thus, the protrusion defined by the line recesses LR may be arranged on the upper surface of the first conductive line 200 and the cell structure 300 may be arranged on each protrusion P. Therefore, the first electrode 310 of the cell structure 300 may be arranged higher than a bottom of the line recess LR.

The line recess LR may be filled with the insulation column IC and the neighboring cell structures 300 on the same first conductive line 200 may be node-separated from each other by the insulation column IC.

When the cell selection signal is applied to a selection cell and a heat may be generated from the first electrode 310 of the selection cell, the heat transfer between the selection cell and an adjacent cell neighboring the selection cell may be sufficiently prevented by the insulation column IC. Since the heat transfer path between the selection cell and the adjacent cell may increase in accordance with the depth of the line recess LR, the thermal cross talk between the selection cell and the adjacent cell may be sufficiently reduced due to the line recess LR, e.g., the thermal cross talk between the selection cell and the adjacent cell may be reduced as the depth of the line recess LR increases.

The configurations and structures of the selection element 320, the data storage element 340, and the electrode element may be varied according to the requirements and specifications of the semiconductor memory device 1000.

Figure 5A:
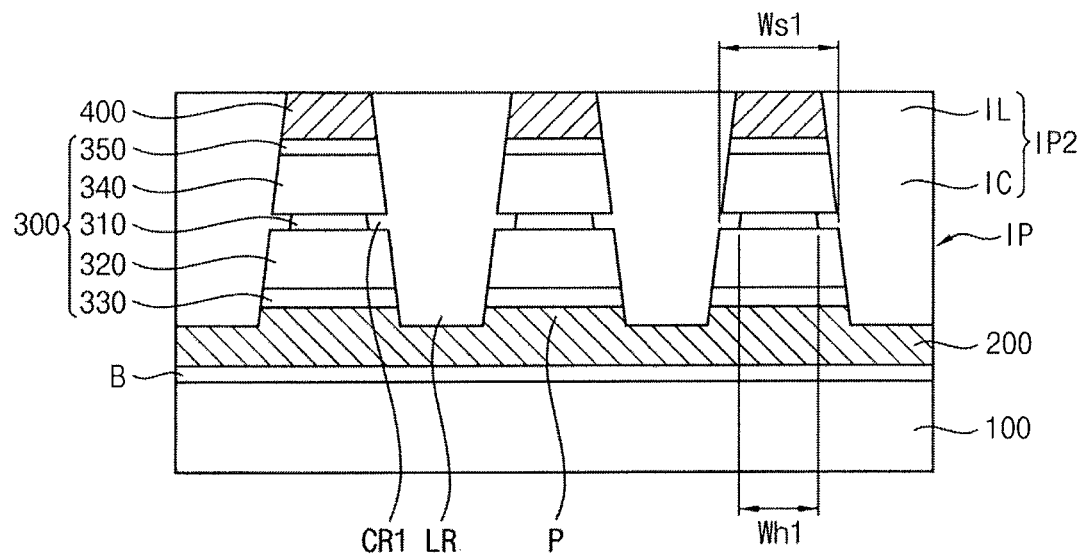
FIGS. 5A and 5B illustrate cross-sectional views of a first modification of the semiconductor memory device shown in FIGS. 4A and 4B.
Figure 5B:
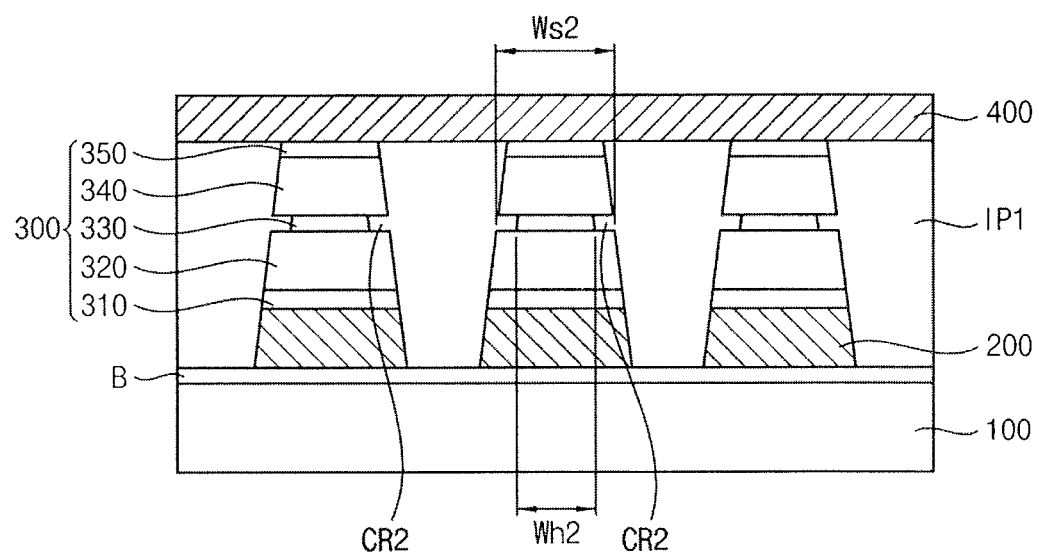

FIGS. 5A and 5B are cross-sectional views illustrating a first modification of the semiconductor memory device shown in FIGS. 4A and 4B. In FIGS. 5A and 5B, the cell structure 300 may have the same structures as the cell structure shown in FIGS. 4A and 4B, except that the first electrode 310 may be replaced, e.g., swapped, with the second electrode 330.

Referring to FIGS. 5A and 5B, the cell structure 300 of the first modified semiconductor memory device may include a multilayer structure in such a configuration that the second electrode 330, the selection element 320, the first electrode 310, the data storage element 340, and the third electrode 350 may be sequentially stacked on the first conductive line 200 in the trapezoidal shape. In such a case, the second electrode 330 may function as a contact plug between the selection element 320 and the first conductive line 200, while the first electrode 310 may still have a contact area smaller than an upper surface of the selection element 320 and a lower surface of the data storage element 340.

For example, the first electrode 310 may have a width smaller than those of the selection element 320 and the data storage element 340 along the first and the second directions x and y, thus the cell structure 300 may have first and second cell recesses CR1 and CR2 that may be defined by the side surface of the first electrode 310, the upper surface of the selection element 320, and the lower surface of data storage element 340. The first recess CR1 may be filled with the insulation column IC and the second recess CR2 may be filled with the first insulation column IP1.

Since the first electrode 310, from which heat may be generated, does not contact the first conductive line 200, the depth of the line recess LR may be reduced or minimized, e.g., no line recess LR for reducing the thermal cross talk may be provided with the first conductive line 200. Although not shown in figures, the selection element 320 may be replaced with the data storage element 340, so the selection element 320 may be positioned on the first electrode 310 and the data storage element 340 may be positioned under the first electrode 310.

Figure 6A:
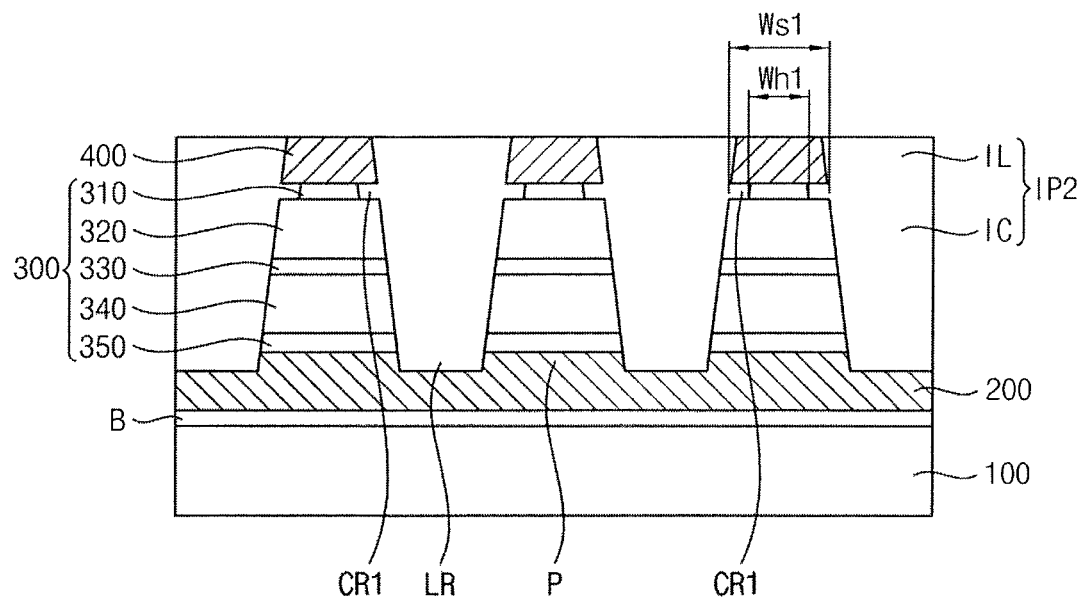
FIGS. 6A and 6B illustrate cross-sectional views of a second modification of the semiconductor memory device shown in FIGS. 4A and 4B.
Figure 6B:
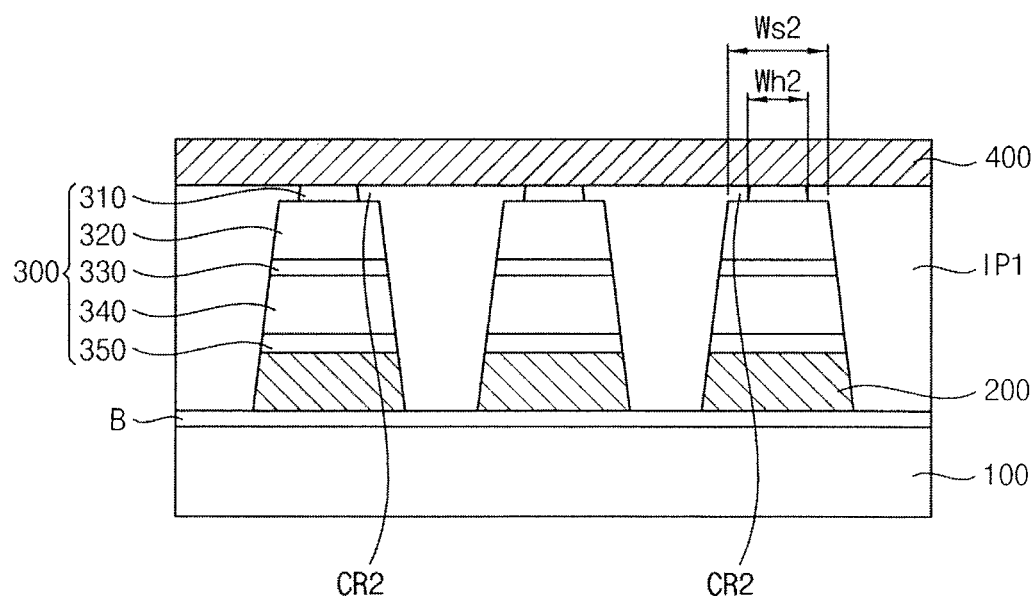

FIGS. 6A and 6B are cross-sectional views illustrating a second modification of the semiconductor memory device shown in FIGS. 4A and 4B. In FIGS. 6A and 6B, the first and the second conductive lines 200 and 400 may function as a bit line and a word line, respectively, while the first and the second conductive lines 200 and 400 may function as a word line and a bit line, respectively, in FIGS. 4A to 5B.

Referring to FIGS. 6A and 6B, the cell structure 300 of the second modified semiconductor memory device may include a multilayer structure in such a configuration that the third electrode 350, the data storage element 340, the second electrode 330, the selection element 320, and the first electrode 310 may be sequentially stacked on the first conductive line 200 in the trapezoidal shape. In such a case, the first electrode 310 may be interposed between the second conductive line 400 and the selection element 320 and may have a contact area smaller than the upper surface of the selection element 320.

For example, the first electrode 310 may have a width smaller than those of the selection element 320 along the first and the second directions x and y, thus the cell structure 300 may have first and second cell recesses CR1 and CR2 that may be defined by the side surface of the first electrode 310, the upper surface of the selection element 320, and the second conductive line 400. The first recess CR1 may be filled with the insulation column IC and the second recess CR2 may be filled with the first insulation column IP1.

Since the first electrode 310, from which heat may be generated, may not contact the first conductive line 200, the depth of the line recess LR may be reduced, e.g., no line recess LR for reducing the thermal cross talk may be provided with the first conductive line 200.

In a modified example, some peripheral structures including a peripheral circuit for applying driving signals to the cell structures 300 may be further provided under the buffer layer B, so that the semiconductor memory device 1000 may be provided as a cell over peripheral circuit (COP) structure in which the peripheral structure and the memory cell array may be sequentially stacked on the substrate 100.

Figure 7:
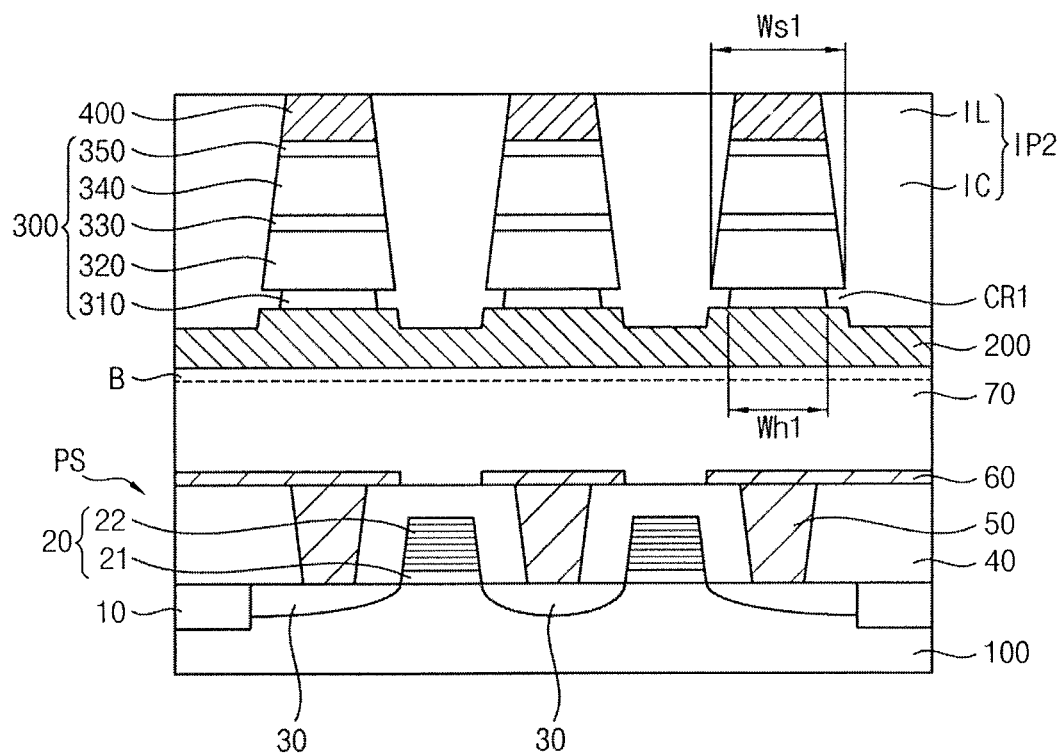
FIG. 7 illustrates a cross-sectional view of a semiconductor memory device in which peripheral circuit structures are provided under the cell structure in accordance with an embodiment.

FIG. 7 is a cross-sectional view illustrating the semiconductor memory device in which peripheral circuit structures are provided under the cell structure in accordance with an example embodiment.

Referring to FIG. 7, a peripheral structure PS may be arranged on the substrate 100 and the cell structure 300 may be arranged over the peripheral structure PS. Thus, the peripheral structure PS may be provided on the substrate 100 under the buffer layer B and under the first conductive line 200, and the cell structure 300 may be provided on the buffer layer B, so that the peripheral structure PS and the cell array may be vertically stacked on the substrate 100. For example, the peripheral structure PS may control various signals, e.g., a data signal, a power signal, and a ground signal, that may be applied to the cell structures 300.

For example, the peripheral structure PS may include a peripheral gate structure 20 and a junction area 30 around the peripheral gate structure 20, a contact plug 50 making contact with the junction area 30, and a wiring structure 60 making contact with the contact plug 50. The peripheral gate structure 20 and the junction area 30 may be arranged on an active region of the substrate 100 that may be defined by a device isolation layer 10. The cell structure 300 may be arranged over the peripheral structure PS.

The peripheral gate structure 20 may include a gate insulation pattern 21 and a gate electrode on the gate insulation pattern 21. The gate insulation pattern 21 may include insulation materials such as silicon oxide and metal oxide, and the gate electrode 22 may include conductive materials such as polysilicon doped with impurities and metal that may be partially cover with metal silicide and/or metal nitride. A gate spacer may be further provided at sidewalls of the peripheral gate structure 20. A plurality of n-type dopants or p-type dopants may be implanted onto a junction area around the peripheral gate structure 20 and thus the junction area 30 may be provided around the peripheral gate structure 20.

The peripheral gate structure 20 and the junction area 30 may constitute a NMOS or a PMOS transistor according to the polarity of the dopants in the junction area 30.

An insulation interlayer 40 may be provided on the NMOS or PMOS transistor in such a way that the transistor may be protected and insulated from its surroundings. The insulation interlayer 40 may include silicon oxide.

The contact plug 50 may penetrate through the insulation interlayer 40 and make contact with the junction area 30, and the wiring structure 60 may make contact with an upper portion of the contact plug 50. The wiring structure 60 may include a plurality of wiring lines that may extend in first and/or second directions and be spaced apart by the same gap distance. In addition, the wiring lines may be vertically stacked on the insulation interlayer 40 in a medium of at least an additional insulation interlayer. The contact plug 50 and the wiring structure 60 may include metal, metal nitride, metal silicide and polysilicon doped with impurities. Some of the wiring structures 60 may be connected to the first conductive line 200 and/or the second conductive line 400 directly or in a medium of a via structure.

A protection layer 70 may be provided on the wiring structure 60 and thus the wiring structure 60 may be separated and insulated from surroundings. The protection layer 70 may include oxide such as silicon oxide.

The cross point cell array including the first and the second conductive lines 200 and 400 and the cell structures at the cross points of the first and the second conductive lines 200 and 400 may be arranged on the protection layer 70. In the present example embodiment, the protection layer 70 may include the buffer layer B. While the present example embodiment discloses that the peripheral structure PS may be arranged under the cross point cell array as the COP structure, the peripheral structure PS may also be arranged over the cross point cell array as a peripheral circuit over cell (POC) structure.

According to the semiconductor memory device 1000 of the present example embodiment, the width of the first electrode 310 may be reduced to be smaller than that of the selection element 320 along the first and the second directions x and y, thereby increasing the gap distance between the neighboring cell structures 300 and enlarging the insulation space between the neighboring cell structures 300. As a result, the neighboring cell structures 300 may be insulated from each other by more insulation materials filling in the insulation space and the insulation characteristics of the cell structures 300 may be improved. Therefore, the electrical interference between the neighboring cell structures 300 may be sufficiently reduced due to the improvement of the insulation characteristics. Particularly, the reduction of the electrical interference may significantly improve the operation reliability of semiconductor memory device in case that the cross point cell array may be highly integrated with a low cell pitch.

Figure 8:
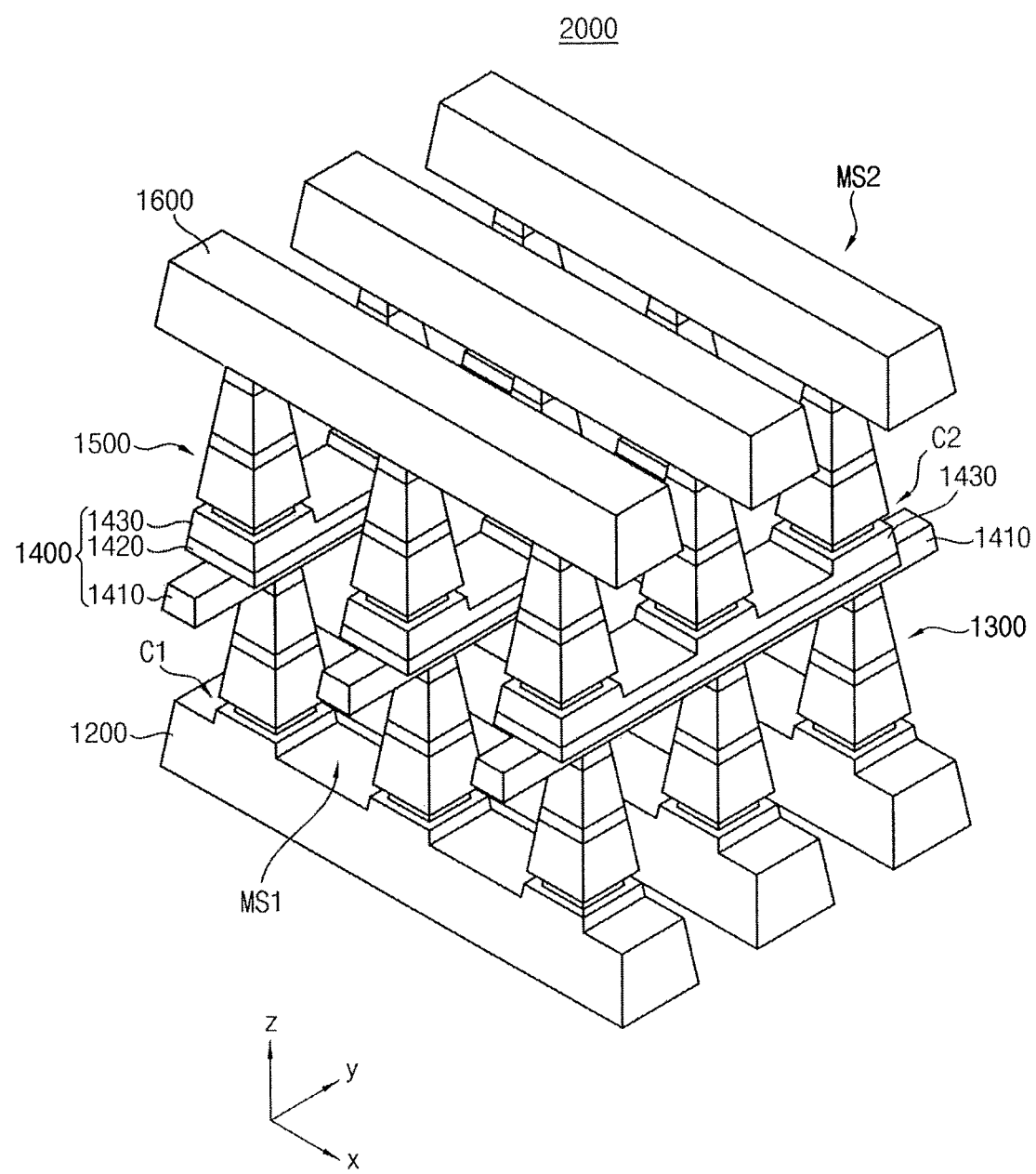
FIG. 8 illustrates a perspective view of a semiconductor memory device having a cell array shown in FIG. 2 in accordance with another example embodiment.
Figure 9A:
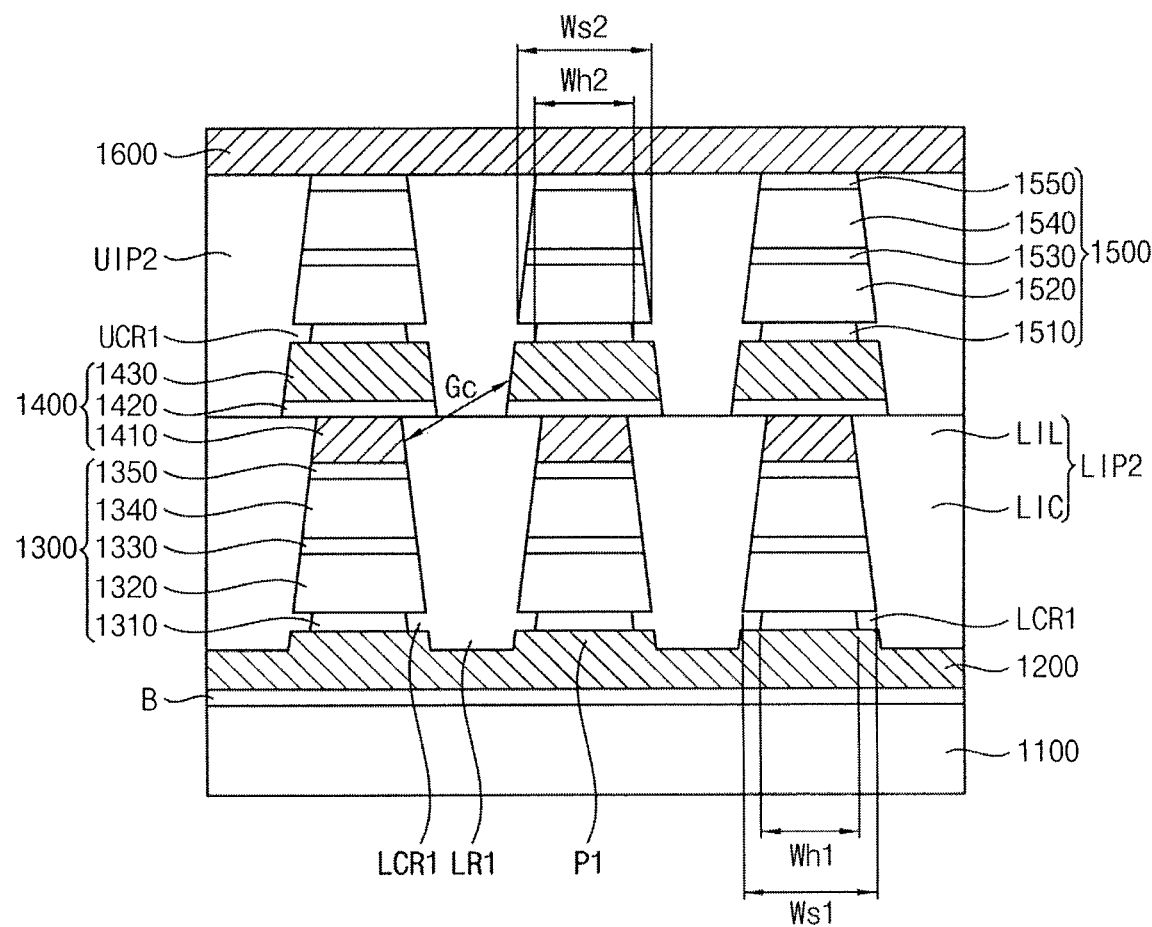
FIG. 9A illustrates a cross-sectional view along line I-I' of FIG. 2 in the device of FIG. 8.

FIG. 8 is a perspective view illustrating a semiconductor memory device having a cell array shown in FIG. 2 in accordance with another example embodiment. FIG. 9A is a cross-sectional view of the semiconductor memory device in FIG. 8 along line I-I' of FIG. 2, and FIG. 9B is a cross-sectional view of the semiconductor memory device in FIG. 8 along line II-II' of FIG. 2.

The semiconductor memory device 2000 in FIG. 8 has the same structure as the semiconductor memory device 1000, except for a 3-dimensional cross point cell array structure. Thus, a plurality of the first and the second conductive lines may extend in the first and the second directions x and y and the cell structures may be arranged between the first and the second conductive lines in a multi-stack structures in the third direction z.

Figure 9B:
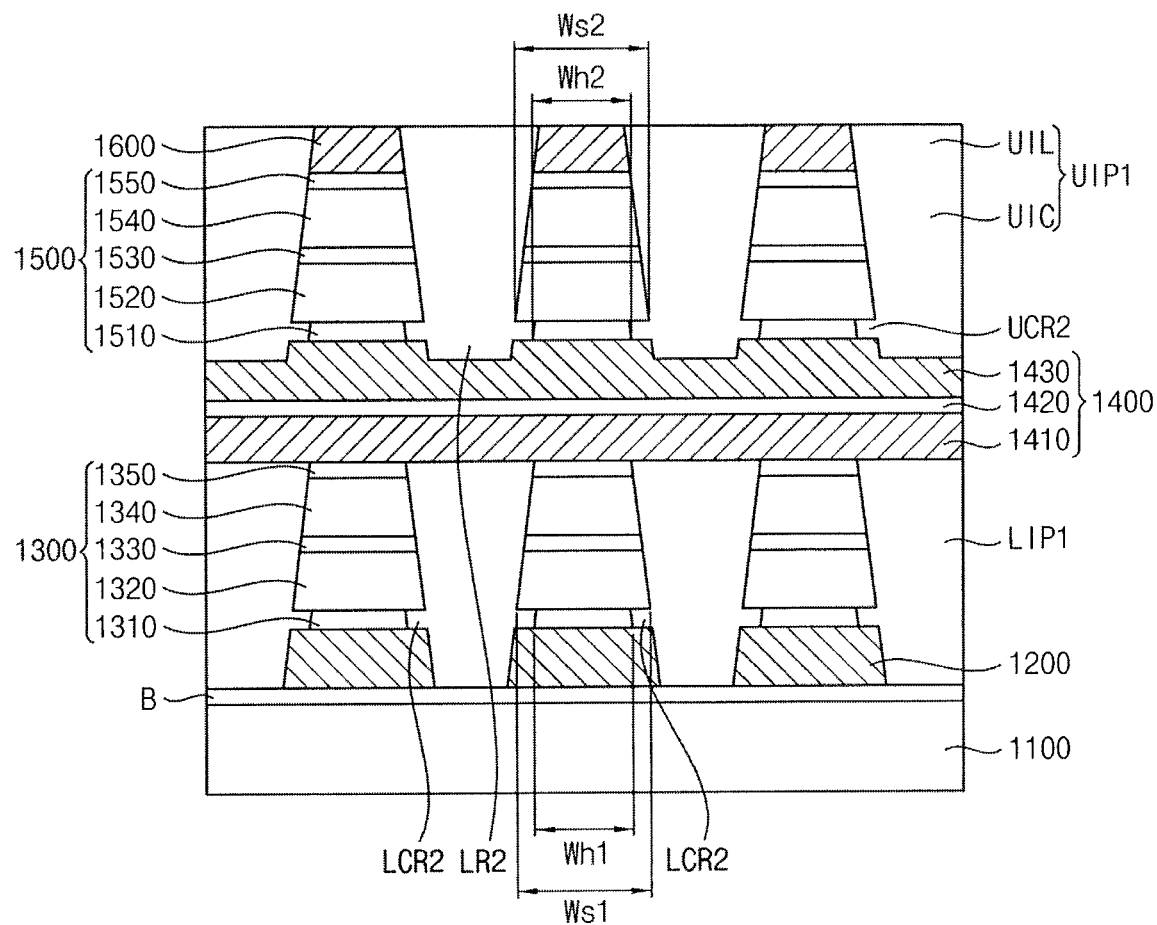
FIG. 9B illustrates a cross-sectional view along line II-II' of FIG. 2 in the device of FIG. 8.

Referring to FIGS. 8 to 9B, the semiconductor memory device 2000 in accordance with another example embodiment may include a lower conductive line 1200 extending in a first direction x on a substrate 1100, a middle conductive line 1400 extending in a second direction y over the lower conductive line 1200 such that the lower and the middle conductive lines 1200 and 1400 may cross each other at a plurality of first cross points C1 and the middle conductive line 1400 may have a first component line 1410 and a second component line 1430 having a width greater than that of the first component line 1410, an upper conductive line 1600 extending in the first direction x over the middle conductive line 1400 such that the middle and the upper conductive lines 1400 and 1600 may cross each other at a plurality of second cross points C2, a plurality of first cell structures 1300 positioned on each of the first cross points C1 of the lower conductive line 1200 and the first component line 1410, and a plurality of second cell structures 1500 positioned on each of the second cross points C2 of the second component line 1420 and the upper conductive line 1600. Each of the first cell structures 1300 may include a first data storage element 1340, a first selection element 1320 that may apply a cell selection signal to the first data storage element 1340 and changes a data state of the first data storage element 1340 and a lower electrode element having at least an electrode of which a contact area is smaller than that of the first selection element 1320. Each of the second cell structures 1500 may include a second data storage element 1540, a second selection element 1520 that may apply a cell selection signal to the second data storage element 1540 and changes a data state of the second data storage element 1540 and an upper electrode element having at least an electrode of which a contact area is smaller than that of the second selection element 1540.

In FIG. 8, the lower, the middle and the upper conductive lines 1200, 1400 and 1600 may be stacked over the substrate 1100 and the first and the second cell structures 1300 and 1500 may be interposed therebetween in a two-storied memory stack. However, any additional conductive lines may be further provided over the upper conductive line 1600 and other additional cell structures may be interposed therebetween in a three or more story memory stacks.

The lower conductive line 1200 on the buffer layer B and the first cell structure 1300 may have the same structures as the first conductive line 200 and the cell structure 300 of the semiconductor memory device 1000 in FIG. 1.

Thus, the buffer layer B may be arranged on the substrate 1100 and the lower conductive line 1200 may extend in the first direction x on the buffer layer B and a plurality of the lower conductive lines 1200 may be spaced apart by the same gap distance in the second direction y. First protrusions P1 and first line recesses LR1 may be alternately arranged on the lower conductive line 1200 and the first protrusion P1 may correspond to the first cross point C1 of the lower and the middle conductive lines 1200 and 1400. The first cell structure 1300 may be positioned on each of the first protrusions P1, so that the neighboring first cell structures 1300 adjacent to each other in the first direction x may be separated by a lower insulation column LIC in such a configuration that a bottom of the first cell structure 1300 may be higher than a bottom of the lower insulation column LIC, thereby reducing the thermal cross talk between the neighboring first cell structures 1300 along the lower conductive line 1200. The first line recess LR1 may be selectively provided with the lower conductive line 1200 in accordance with the structures and configurations of the first cell structure 1300.

The first cell structure 1300 may be individually positioned at every cross point of the lower conductive line 1200 and the middle conductive line 1400 and may be node-separated by a first lower insulation pattern LIP1 extending in the first direction x and a second lower insulation pattern LIP2 extending in the second direction y. The second lower insulation pattern LIP2 may include a lower insulation line LIL and the lower insulation column LIC. The lower insulation column LIC may be positioned in the first line recess LR1 and the neighboring first cell structures 1300 may be insulated by the lower insulation column LIC along the first direction x.

For example, the first cell structure 1300 may include a multilayer structure that may be stacked on the first cross point C1 of the lower conductive line 1200 and the middle conductive line 1400 in a trapezoidal shape.

The first cell structure 1300 may include the unit cell of a PRAM device and may include the first data storage element 1340 for storing a bit data as a material phase, the first selection element 1320 for individually controlling the material phase of the first data storage element 1340 and a plurality of lower electrodes 1310, 1330 and 1350 one of which may have a contact area smaller than that of the first selection element 1320. In the present example embodiment, the first cell structure 1300 may be shaped into a trapezoid in which a width of the first cell structure 1300 may decrease upwards from the lower conductive line 1200 to the middle conductive line 1400. Particularly, the first cell structure 1300 may include a multilayer structure in which the first lower electrode 1310 for generating heat, the first selection element 1320, the second lower electrode 1330, the first data storage element 1340 and the third lower electrode 1350 may be sequentially stacked on the lower conductive line 1200 in the trapezoidal shape. In such a case, the first lower electrode 1310 may have a contact area smaller than the lower surface of the first selection element 1320. The third lower electrode 1350 may make contact with the middle conductive line 1400.

For example, the first lower electrode 1310 may have a width smaller than that of the first selection element 1320 along the first and the second directions x and y, thus the first cell structure 1300 may have first and second lower cell recesses LCR1 and LCR2 that may be defined by the side surface of the first lower electrode 1310, the lower surface of the first selection element 1320 and an upper surface of the lower conductive line 1200 and may be filled with the first and the second lower insulation patterns LIP1 and LIP2.

Particularly, the first lower electrode 1310 may be replaced with one of the second lower electrode 1330 or the third lower electrode 1350, as described in detail with reference to FIGS. 5A to 6B. Thus, the first and the second lower cell recesses LCR1 and LCR2 may be replaced according to the position of the first lower electrode 1310.

For example, the width of the first lower electrode 1310 may be about ½ to about ¼ times the width of the first selection element 1320, thus the contact area of the first lower electrode 1310 may be about ¹⁄₁₆ to about ¼ times the lower surface of the first selection element 1320. Particularly, the contact area of the first lower electrode 1310 may be about ¹⁄₁₀ to about ¼ times the lower surface of the first selection element 1320.

The structures and compositions of the first cell structure 1300 may be substantially the same as the cell structure 300 of the semiconductor memory device 1000 shown in FIG. 1, thus any further detailed descriptions on the first cell structure 1300 will be omitted. While the present example embodiment discloses that the first cell structure 1300 may include a unit cell of the PRAM device, the first cell structure 1300 may also be applied to a unit cell of any other non-volatile memory devices such as a resist RAM (RRAM) device and a magnetic RAM (MRAM) device.

For example, the middle conductive line 1400 may be a line extending in the second direction y and may make contact with an upper portion of the first cell structure 1300. Thus, the first cell structure 1300 may be positioned between the lower and the middle conductive lines 1200 and 1400 and may constitute a first memory stack MS1 of the semiconductor memory device 2000.

Particularly, the middle conductive line 1400 may include a first component line 1410 making contact with the first cell structure 1300, a second component line 1430 having a width greater than that of the first component line 1410 along the first direction x and making contact with the second cell structure 1500, and a separation line 1420 interposed between the first and the second component lines 1410 and 1430. The separation line 1420 may have a same width along the first direction x and may be co-extensive along the second direction y as the second component line 1430. The second component line 1430 may have a stepped structure in which portions to contact the second cell structure 1500 may extend further along the third direction z than between adjacent second cells structure 1500.

The first component line 1410, the separation line 1420 and the second component line 1430 may be sequentially on the first cell structure 1300 and the first lower insulation pattern LIP1 in the named order. Particularly, the first and the second component lines 1410 and 1430 may include the same conductive materials and the separation line 1420 may include a nitride of a conductive metal. Examples of the conductive materials for the first and the second component lines 1410 and 1430 may include tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), etc. These may be used alone or in combinations thereof.

The first component line 1410 and the first cell structure 1300 may be shaped into a first single trapezoid, thus a side surface of the first component line 1410 may be coplanar with a side surface of the first cell structure at the same slant angle. That is, the first component line 1410 may be positioned at a top portion of the first trapezoid, thus the width of the first component line 1410 may be smaller than the first data storage element 1340 or the third lower electrode 1350.

In contrast, the separation line 1420 and the second component line 1430 and the second cell structure 1500, which may be positioned on the second component line 1430, may also be shaped into a second single trapezoid, thus side surfaces of the separation line 1420 and the second component line 1413 may be coplanar with a side surface of the second cell structure 1500 at the same slant angle. That is, the second component line 1430 may be positioned at a bottom portion of the second trapezoid, thus the width of the second component line 1430 may be larger than the second selection element 1540.

The second component line 1430 and the separation line 1420 may constitute a bottom portion of the second trapezoid together with the second cell structure 1500 and the first component line 1410 may constitute a top portion of the first trapezoid together with the first cell structure 1300. Thus, the side surface of the first component line 1410 may be discontinuous with the side surfaces of the separation line 1420 and the second component line 1430.

Therefore, the first component line 1410 contact with the first cell structure 1300 and the second component line 1430 contact with the second cell structure 1500 adjacent to the first cell structure 1300 may be much more spaced apart from each other due to the width difference between the first and the second component lines 1410 and 1430. That is, a cross gap Gc of the middle conductive line 1400 between the neighboring first and second memory stacks MC1 and MC2 may increase, thus the insulation space between the neighboring middle conductive lines 1400 may be maximized due to the trapezoidal shape of the first and the second cell structures 1300 and 1500. The increase of the insulation space may result in the increase the widths of the second lower insulation pattern LIP2 and a second upper insulation pattern UIP2, as will be described in detail hereinafter, thereby increasing the breakdown voltage margin between the first cell structure 1300 and the second cell structure 1500 adjacent to each other.

While the present example embodiment discloses that the first and the second trapezoid may have the same shape and thus the side surfaces of the first and the second component lines 1410 and 1430 may have the same slant angle, the first trapezoid of the first memory stack MS1 would be different from the second trapezoid of the second memory stack MS2 and thus the side surface of the first component line 1410 may have a slant angle different from that of the second component line 1430.

The first component line 1410 may extend in the second direction y and may be alternately contact with the first cell structure 1300 and the first lower insulation pattern line LIP1 and a plurality of the first cell structures 1300 at every cross point C1 of the lower conductive line 1200 and the first component line 1410 may constitute the cross point cell array of the first story memory stack.

The neighboring first component lines 1410 may be separated from each other by the lower insulation line LIL that may extend in the second direction y. Thus, the lower insulation line LIL may cross the first lower insulation pattern LIP1 and have an upper surface that may be coplanar with an upper surface of the first component line 1410.

Particularly, the upper surface of the lower insulation column LIC may be lower than or equal to a lower surface of the lower insulation line LIL. When the upper surface of the lower insulation column LIC may be the same level as the lower surface of the lower insulation line LIL, the lower insulation column LIC and the lower insulation line LIL may constitute the second lower insulation pattern LIP2 that may be integrally formed in one body by a single process. Thus, the first cell structures 1300 may be node-separated from one another by the first and the second lower insulation patterns LIP1 and LIP2.

The trapezoidal stack line of the separation line 1420 and the second component line 1430 may extend in the second direction y and a plurality of the trapezoidal stack lines may be separated by a second upper insulation pattern UIP2 that may be contact with the lower insulation line LIL and may be shaped into a line extending in the second direction y.

Second protrusions P2 and second line recesses LR2 may be alternately arranged on the second component line 1430 and the second protrusion P2 may correspond to the second cross point C2 of the second conductive line 1430 and the upper conductive line 1600. The second cell structure 1500 may be positioned on each of the second protrusions P2, so that the neighboring second cell structures 1500 adjacent to each other in the second direction y may be separated by an upper insulation column UIC in such a configuration that a bottom of the second cell structure 1500 may be higher than a bottom of the upper insulation column UIC, thereby reducing the thermal cross talk between the neighboring second cell structures 1500 along the second component line 1430. The second line recess LR2 may be selectively provided with the second component 1430 in accordance with the structures and configurations of the second cell structure 1500.

The second cell structure 1500 may be individually positioned at each of the second cross points C2 of the middle and the upper conductive lines 1400 and 1600, and may be node-separated by a second upper insulation pattern UIP2 extending in the second direction y and a first upper insulation pattern UIP1 extending in the first direction x. The first upper insulation pattern UIP1 may include an upper insulation line UIL and the upper insulation column UIC. The upper insulation column UIC may be positioned in the second line recess LR2 and the neighboring second cell structures 1500 may be insulated by the upper insulation column UIC along the second direction y.

For example, the second cell structure 1500 may include a multilayer structure that may be stacked on the second cross point C2 of the second component line 1430 and the upper conductive line 1600 in a trapezoidal shape.

The second cell structure 1500 may include a unit cell of a PRAM device and may include the second data storage element 1540 for storing a bit data as a material phase, the second selection element 1520 for individually controlling the material phase of the second data storage element 1540 and a plurality of upper electrodes 1510, 1530, and 1550, one of which may have a contact area smaller than that of the second selection element 1520. In the present example embodiment, the second cell structure 1500 may be shaped into a trapezoid in which a width of the second cell structure 1500 may decrease upwards from the separation line 1420 to the upper conductive line 1600. Particularly, the second cell structure 1500 may include a multilayer structure in which the first upper electrode 1510 for generating heat, the second selection element 1520, the second upper electrode 1530, the second data storage element 1540 and the third upper electrode 1550 may be sequentially stacked on the second component line 1430 along the third direction z in the trapezoidal shape. In such a case, the first upper electrode 1510 may have a contact area smaller than the lower surface of the second selection element 1520 and an upper surface of the second component line 1430. The third upper electrode 1550 may make contact with the upper conductive line 1600.

For example, the first upper electrode 1510 may have a width smaller than that of the second selection element 1520 along the first and the second directions x and y, thus the second cell structure 1500 may have first and second upper cell recesses UCR and UCR2 that may be defined by the side surface of the first upper electrode 1510, the lower surface of the second selection element 1520 and the upper surface of the second component line 1430, and may be filled with the first and the second upper insulation patterns UIP1 and UIP2.

Particularly, the first upper electrode 1510 may be replaced with one of the second upper electrode 1530 or the third upper electrode 1550, as described in detail with reference to FIGS. 5A to 6B. Thus, the first and the second upper cell recesses UCR1 and UCR2 may be replaced according to the position of the first upper electrode 1510.

Particularly, when the lower and the upper conductive lines 1200 and 1600 may function as word lines and the middle conductive line 1400 may function as a common bit line, the first cell structure 1300 may be provided in such a configuration that the first lower electrode 1310, the first selection element 1320, the second lower electrode 1330, the first data storage element 1340 and the third lower electrode 1350 may be sequentially stacked on the lower conductive line 1200 upwards, while the second cell structure may be provided in such a configuration that the third upper electrode 1550, the second data storage element 1540, the second upper electrode 1530, the second selection element 1520, and the first upper electrode 1510 may be sequentially stacked on the second component line 1430 upwards along the third direction z. In such case, the first memory stack MS1 may be symmetrical with the second memory stack MS2 with respect to the middle conductive line 1400 in the semiconductor memory device 2000.

For example, the width of the first upper electrode 1510 may be about ½ to about ¼ times the width of the second selection element 1520, thus the contact area of the first upper electrode 1510 may be about 1/16 to about ¼ times the lower surface of the second selection element 1520. Particularly, the contact area of the first upper electrode 1510 may be about 1/10 to about ¼ times the lower surface of the second selection element 1520.

The structures and compositions of the second cell structure 1500 may be substantially the same as the cell structure 300 of the semiconductor memory device 1000 shown in FIG. 1, thus any further detailed descriptions on the structures and compositions of the second cell structure 1300 will be omitted. While the present example embodiment discloses that the second cell structure 1500 may include a unit cell of the PRAM device, the second cell structure 1500 may also be applied to a unit cell of any other non-volatile memory devices such as a resist RAM (RRAM) device and a magnetic RAM (MRAM) device.

The upper conductive line 1600 may make contact with an upper portion of the second cell structure 1500 and may extend in the first direction x. Thus, the second cell structure 1500 may be positioned between the middle and the upper conductive lines 1400 and 1600 and may constitute a second memory stack MS2 of the semiconductor memory device 2000.

For example, the upper conductive line 1600 may include the same conductive materials as the lower conductive line 1200 and the middle conductive line 1400, so that may include at least one of tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN) and combinations thereof.

The upper conductive line 1600 and the second cell structure 1500 may be shaped into the second single trapezoid. Thus, a side surface of the upper conductive 1600 may be coplanar with a side surface of the second cell structure 1600 at the same slant angle. That is, the upper conductive 1600 may be positioned at a top portion of the second trapezoid, thus the width of the upper conductive line 1600 may be smaller than the second data storage element 1540 or the third upper electrode 1550.

The upper conductive line 1600 may be alternately contact with the second cell structure 1500 and the second upper insulation pattern line UIP2 and a plurality of the second cell structures 1500 at every second cross point C2 of the upper conductive line 1600 and the second component line 1440 may constitute the cross point cell array of the second story memory stack.

The neighboring upper conductive lines 1600 may be separated from each other by the upper insulation line UIL that may extend in the first direction x. Thus, the upper insulation line UIL may cross the second upper insulation pattern UIP2 and have an upper surface that may be coplanar with an upper surface of the upper conductive line 1600.

Particularly, the upper surface of the upper insulation column UIC may be lower than or equal to a lower surface of the upper insulation line UIL. When the upper surface of the upper insulation column UIC may be the same level as the lower surface of the upper insulation line UIL, the upper insulation column UIC and the upper insulation line UIL may constitute the first upper insulation pattern UIP1 that may be integrally formed in one body by a single process. Thus, the second cell structures 1500 may be node-separated from one another by the first and the second upper insulation patterns UIP1 and UIP2.

Therefore, the cross gap Gc between the first and the second component lines 1410 and 1430 may increase across the neighboring first and the second memory stacks MC1 and MC2, so the insulation space between the neighboring middle conductive lines 1400 may be maximized due to the trapezoidal shape of the first and the second memory stacks. Accordingly, the breakdown voltage margin may increase between the first cell structure 1300 and the second cell structure 1500 adjacent to each other, which may increase the operation reliability of the semiconductor device 2000.

In a modified example, some peripheral structures including a peripheral circuit for applying driving signals to the first and the second cell structures 1300 and 1500 may be further provided between the first memory stack MS1 and the substrate 1100, so that the semiconductor memory device 2000 may be provided as a cell over peripheral circuit (COP) structure in which the peripheral structure and the memory cell array may be sequentially stacked on the substrate 1100.

Figure 10:
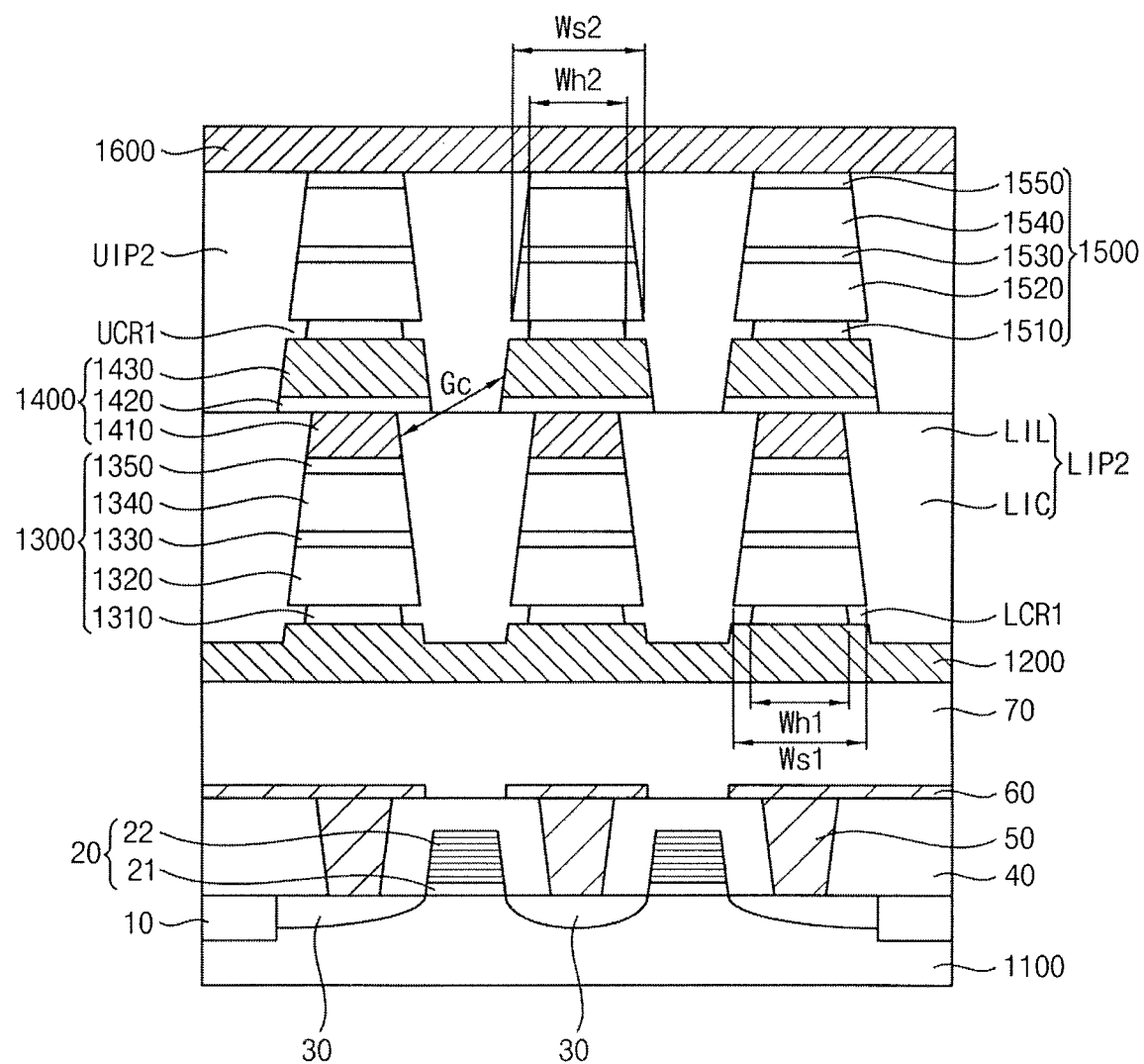
FIG. 10 illustrates a cross-sectional view of a multi-stack memory device in which peripheral circuit structures are provided under the cell structure in accordance with an embodiment.

FIG. 10 is a cross-sectional view illustrating a multi-stack memory device in which peripheral circuit structures are provided under the cell structure in accordance with an example embodiment.

Referring to FIG. 10, a peripheral structure PS may be arranged on the substrate 1100 and the first and the second memory stacks may be arranged over the peripheral structure PS. Thus, the peripheral structure PS may be provided on the substrate 1100 under the first memory stack MS1 and the lower conductive line 1200 and the first cell structure 1300 may be provided on the buffer layer B, so that the peripheral structure PS and the first and the second memory stacks may be vertically stacked on the substrate 1100. For example, the peripheral structure PS may control various signals, such as a data signal, a power signal and a ground signal that may be applied to the first and the second cell structures 1300 and 1500.

For example, the peripheral structure PS may include a peripheral gate structure 20 and a junction area 30 around the peripheral gate structure 20, a contact plug 50 making contact with the junction area 30 and a wiring structure 60 making contact with the contact plug 50. The peripheral gate structure 20 and a junction area 30 may be arranged on an active region of the substrate 1100 that may be defined by a device isolation layer 10. The first and the second memory stacks may be arranged over the peripheral structure PS.

The configurations and structures of the peripheral structure PS may be substantially the same as the peripheral structure PS described in detail with reference to FIG. 7, thus any further detailed descriptions on the peripheral structure PS will be omitted.

Some of the wiring structures 60 may be individually connected to the lower conductive line 1200, the middle conductive line 1400 and the upper conductive line 1600 directly or in a medium of a via structure (not shown).

Hereinafter, a method of manufacturing the semiconductor memory device in detail with reference to FIGS. 11A to 26B.

FIGS. 11A to 26B are cross-sectional views illustrating processing steps for a method of manufacturing the semiconductor memory device in accordance with an example embodiment. In the present example embodiment, the method of manufacturing the semiconductor memory device 2000 shown in FIG. 8 is exemplarily disclosed. However, the present manufacturing method would be applied to the manufacturing method for three more stack memory devices. Hereinafter, the capital letter 'A' in figure numbers denotes a cross-sectional view cutting the semiconductor memory device shown in FIG. 8 in line I-I' of the layout shown in FIG. 2 and the capital letter 'B' in figure numbers denotes a cross-sectional view cutting the semiconductor memory device shown in FIG. 8 in line II-II' of the layout shown in FIG. 2.

Figure 11A:
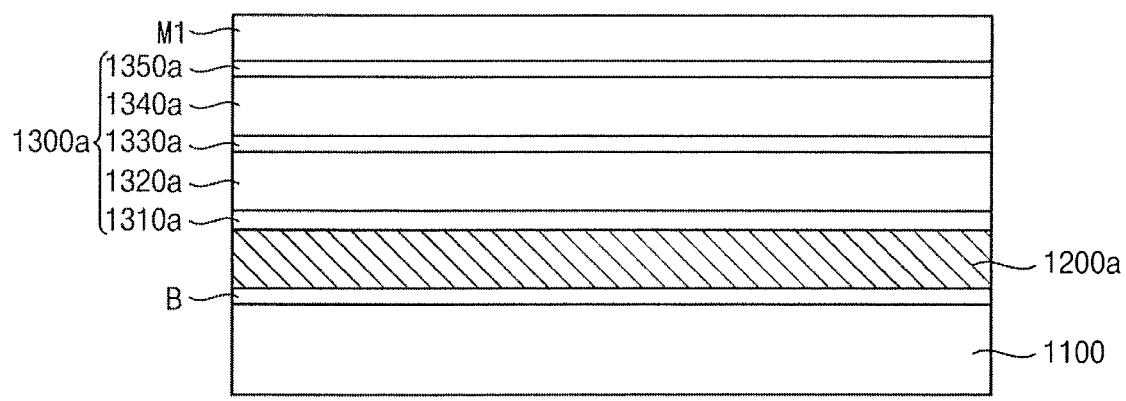
FIGS. 11A to 26B illustrate cross-sectional views of stages in a method of manufacturing a semiconductor memory device in accordance with an embodiment.
Figure 11B:
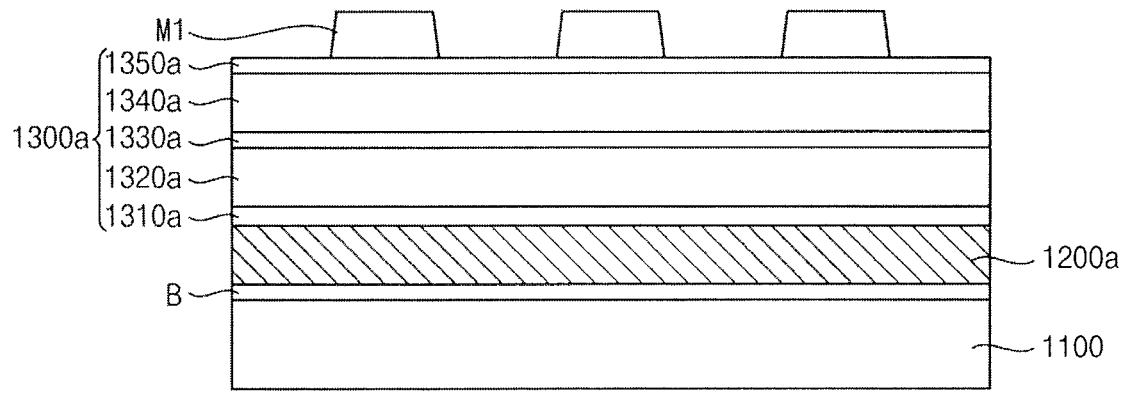

Referring to FIGS. 11A to 11B, an insulating buffer layer B may be formed on the substrate 1100 and a lower conductive layer 1200a for the lower conductive line 1200 and a first multilayer 1300a for the first cell structures 1300 may be formed on the buffer layer B. A first mask pattern M1 may be formed on the first multilayer 1300a. The first mask pattern M1 may be formed into a line pattern extending in the first direction x and spaced apart by the same gap distance in the second direction y.

The substrate 1100 may include a semiconductor substrate such as a silicon wafer and an insulating semiconductor substrate such as a silicon-on-insulator (SOI) substrate.

Low resistive metals may be deposited on the buffer layer B by a deposition process or may be implanted onto the buffer layer B by an ion implantation process. Examples of the low resistive metals may include tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), etc. These may be used alone or in combinations thereof.

The first multilayer 1300a may be formed into the first cell structures 1300 in a subsequent process and may include a plurality of component layers of the first cell structure 1300. That is, the component layers for the first cell structure 1300 may be sequentially stacked on the lower conductive layer 1200a.

In the present example embodiment, the first cell structure 1300 may include a unit cell of the phase changeable random access memory (PRAM) device in which the cell data may be stored through the phase change of the first cell structure 1300 between crystalline and amorphous structures. Thus, a first lower electrode layer 1310a, which may be formed into a heater for generating Joule's heat, may be formed on the lower conductive layer 1200a, and a first selection layer 1320a including a phase changeable material may be formed on the first lower electrode layer 1310a. When an OTS may be used for the first selection element 1320, an amorphous layer for forming the OTS may be formed on the first lower electrode layer 1310a. However, the compositions and structures of the first selection layer 1320a may be varied according to the selection element 1320 of the semiconductor device 2000.

Then, a second lower electrode layer 1330a may be formed on the first selection layer 1320a, and a data storage layer 1340a may be formed on the second lower electrode layer 1330a. Thereafter, a third lower electrode layer 1350a may be further formed on the data storage layer 13540a. The third lower electrode layer 1350a may function as a contact plug between the first cell structure 1300 and the middle conductive line 1400.

Metals that may be non-reactive to the first selection layer 1320a may be deposited onto the lower conductive layer 1200a by a CVD process, thereby forming the first lower electrode layer 1310a. The first lower electrode layer 1310a may be formed into a single layer structure or a multilayer structure. The single layer structure of the first lower electrode layer 1310a may include tungsten (W), titanium (Ti), aluminum (Al), copper (Cu) and carbon (C). The multilayer layer structure of the first lower electrode layer 1310a may include carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN) and combinations thereof.

The first switching layer 1320a may be formed into the selection element 1320 for selecting an active/inactive mode of each cell of the semiconductor memory device 2000 by switching electrical currents on/off. For example, the first selection element 1320 may include one of a vertical PN junction diode, a shottky diode and an ovonic threshold switch (OTS). Thus, the first switching layer 1320a may include a proper layer structure according to the structure of the first selection element 1320.

For example, the first switching layer 1320a may be formed into a diode layer in which a pair of semiconductor layers having opposite polarity types may be alternately stacked on the first lower electrode layer 1310a.

Otherwise, the first switching layer 1320a may be formed into an amorphous semiconductor layer on the first lower electrode layer 1310a. The amorphous semiconductor layer may have discontinuous voltage-current characteristics and may include at least one of arsenic (As), germanium (Ge), selenium (Se), tellurium (Te), silicon (Si), bismuth (Bi), sodium (S), antimony (Sb) and in combinations thereof.

In the present example embodiment, an amorphous semiconductor layer including arsenic (As), germanium (Ge), tellurium (Te), silicon (Si) may be formed on the first lower electrode layer 1310a, and then selenium (Se) and sodium (S) may be implanted onto the amorphous semiconductor layer by an ion implantation process, thereby forming a 6-element amorphous semiconductor layer as the first switching layer 1320a.

The second lower electrode layer 1330a may function as an anti-diffusion layer between the first selection layer 1320a and the first data storage layer 1340a. For example, the second lower electrode layer 1330a may prevent the material diffusion between the phase changeable materials of the first data storage layer 1340a and the amorphous materials of the first selection layer 1320a such as the OTS.

For example, a metal layer, which may be sufficiently inactive with the phase changeable materials of the first data storage layer 1340a and the amorphous materials of the first selection layer 1320a, may be formed on the first selection layer 1320a and then a silicidation process may be conducted to the metal layer, thereby forming a metal silicide layer as the second lower electrode layer 1330a. The metal silicide for the second lower electrode layer 1330a may include one of tungsten silicide, cobalt silicide, nickel silicide, titanium silicide and tantalum silicide.

The first data storage layer 1340a may include phase changeable materials of which the phase may be changed between the amorphous phase having a relatively higher specific resistance and the crystalline phase having a relatively lower specific resistance according to heating temperature and time.

Examples of the phase changeable materials may include tellurium (Te), selenium (Se), germanium (Ge), antimony (Sb), bismuth(Bi), lead (Pb), tin (Sn), arsenic (As), sodium (S), silicon (Si), phosphorus (P), oxygen (O), etc. These may be used alone or in combinations thereof. For example, the first data storage layer 1340a may include a chalcogenide or a doped chalcogenide with impurities. Examples of the chalcogenide may include Ge—Sb—Te, Ge—Te—As, Sn—Te—Sn, Ge—Te, Sb—Te, Se—Te—Sn, Ge—Te—Se, Sb—Se—Bi, Ge—Bi—Te, Ge—Te—Ti, In—Se, Ga—Te—Se, In—Sb—Te, Bi—Sb—Te, etc. These may be used alone or in combinations thereof.

Otherwise, the first data storage layer 1340a may be formed into a super lattice structure in which two or more materials may be sequentially stacked over by a molecular beam epitaxial (MBE) process or an atomic layer deposition (ALD) process. The super lattice may need significantly low heat for the phase change, thus the phase change of the first data storage element 1340 between the amorphous and crystalline phases may be conducted at a relatively low temperature. For example, the data storage layer 1340a may include an alloy in which GeTe and SbTe may be alternately stacked by a unit of a molecule or an atom.

The third lower electrode layer 1350a may be further formed on the first data storage layer 1340a for a contact plug with the first component line 1410 of the middle conductive line 1400. The third lower electrode 1350 may be provided as a component of the first cell structure 1300 or as an additional interconnection structure between the first cell structure and the first component line 1410. Thus, the third lower electrode layer 1350a may be formed on the first data storage layer 1340a or may be formed in an additional via process before the formation of the middle conductive line 1400. In the present example embodiment, the third lower electrode layer 1350a may be formed on the first data storage layer 1340a and the third lower electrode 1350a may constitute the first cell structure 1300. The third lower electrode layer 1350a may include a low-resistive metal or a metal silicide of the low-resistive metal.

Accordingly, the first lower electrode layer 1310a, the first selection layer 1320a, the second lower electrode layer 1330a, the data storage layer 1340a and the third lower electrode layer 1350a may be sequentially formed on the lower conductive layer 1200a, thereby forming the first multilayer 1300a on the lower conductive layer 1200a.

Thereafter, a mask layer (not shown) may be formed on the first multilayer 1300a and may be patterned into a first mask pattern M1 by a photolithography process. The first mask pattern M1 may be formed into a plurality of lines extending in the first direction x and spaced apart along the second direction y.

Figure 12A:
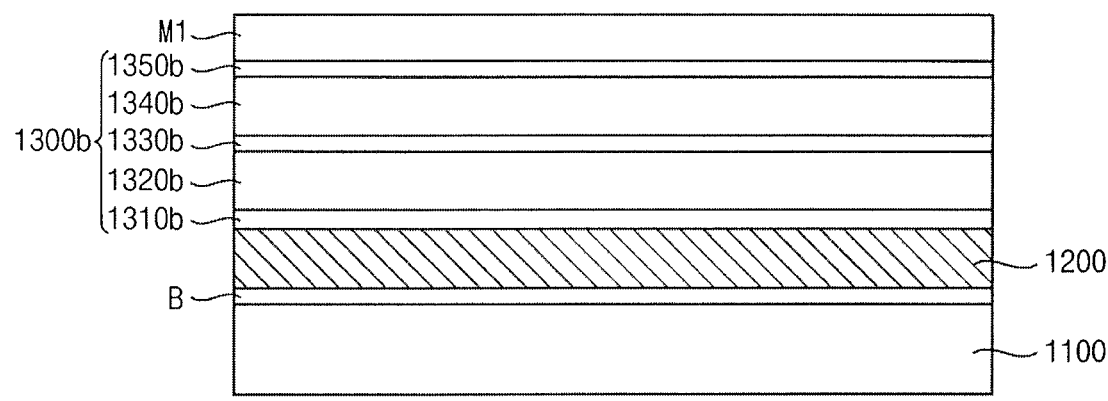
Figure 12B:
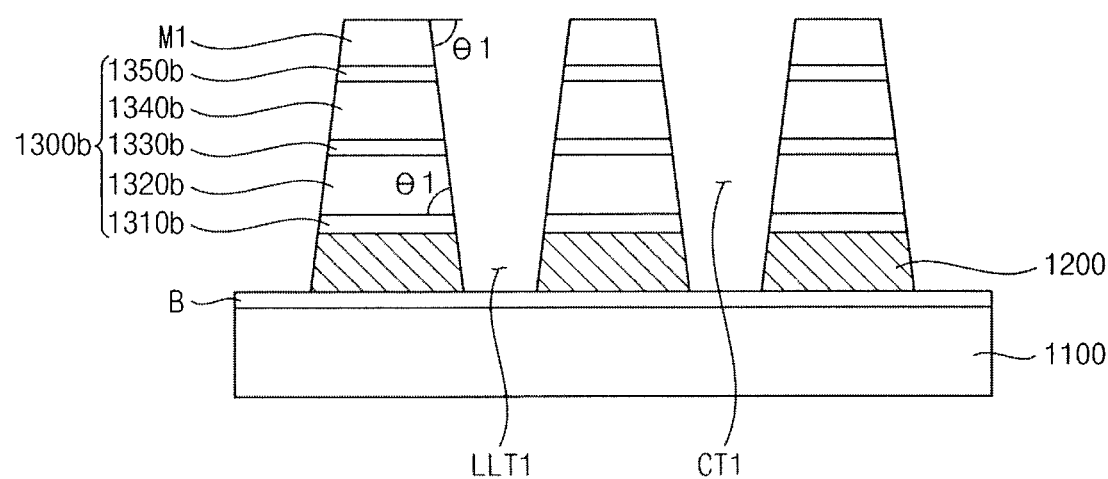

Referring to FIGS. 12A and 12B, the first multilayer 1300a and the lower conductive layer 1200a may be partially removed from the buffer layer B on the substrate 1100 by an etching process using the first mask pattern M1 as an etching mask, thereby forming a first lower line trench LLT1 and a first cell trench CT1 that may extend in the first direction x.

The third lower electrode layer 1350a, the first data storage layer 1340a, the second lower electrode layer 1330a, the first selection layer 1320a and the first lower electrode layer 1310a may be sequentially etched off from the buffer layer B in a shape of line extending in the first direction x, thereby forming the first cell trench CT1. Then, the lower conductive layer 1200a may be consecutively etched off from buffer layer B to thereby form the first lower line trench LLT1 communicating with the first cell trench CT1 and extending in the first direction x. Accordingly, the first multilayer 1300a may be formed into a plurality of first cell lines 1300b that may be spaced apart by the first cell trench CT1 and the lower conductive layer 1200a may be formed into a plurality of the lower conductive lines 1200 that may be spaced apart by the first lower line trench LLT1. The first cell lines 1300b may include a first lower electrode line 1310b, a first selection line 1320b, a second lower electrode line 1330b, a data storage line 1340b and a third lower electrode line 1350b.

In the present example embodiment, the etching process may be consecutively performed to the first multilayer 1300a and the lower conductive layer 1200a, thus the first cell trench CT1 and the first lower line trench LLT1 may be consecutively formed in the same etching process.

Particularly, the first multilayer 1300a and the lower conductive layer 1200a may be partially removed from the buffer layer B by an anisotropic etching process under etching conditions that the first cell trench CT1 and the first lower line trench LLT1 may be reduced downwards and side walls of the first cell trench CT1 and the first lower line trench LLT1 may be continuous and slanted at a first slant angle θ1, e.g., relative to the second direction y. Accordingly, the lower conductive line 1200 and the first cell line 1300b may be formed into a single trapezoid on the buffer layer B in such a way that the side surface of the first cell line 1300b and the lower conducive line 1200 may be coplanar with each other in the same trapezoid.

For example, the first slant angle θ1 of the trapezoid may be in a range of about 70° to about 85° with respect to an upper surface of the first cell line 1300b, so that the trapezoid of the first cell line 1300b and the lower conductive line 1200 may have a base angle in a range of about 70° to about 85°.

In the present example embodiment, the materials and compositions of the first multilayer 1300a and the lower conductive layer 1200a may be selected and adjusted in such a way that the first cell line 1300b and the lower conductive line 1200 may be etched off in a single etching process in the same etching chamber just by controlling the etching conditions.

Figure 13A:
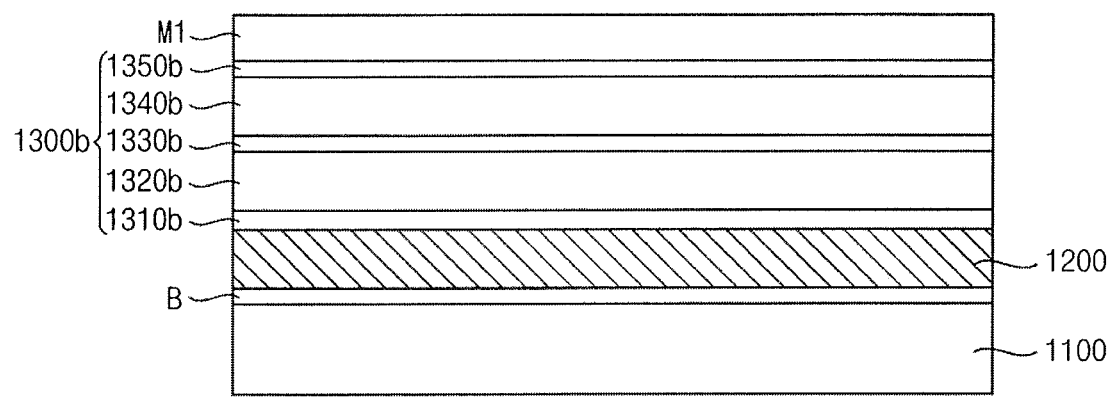
Figure 13B:
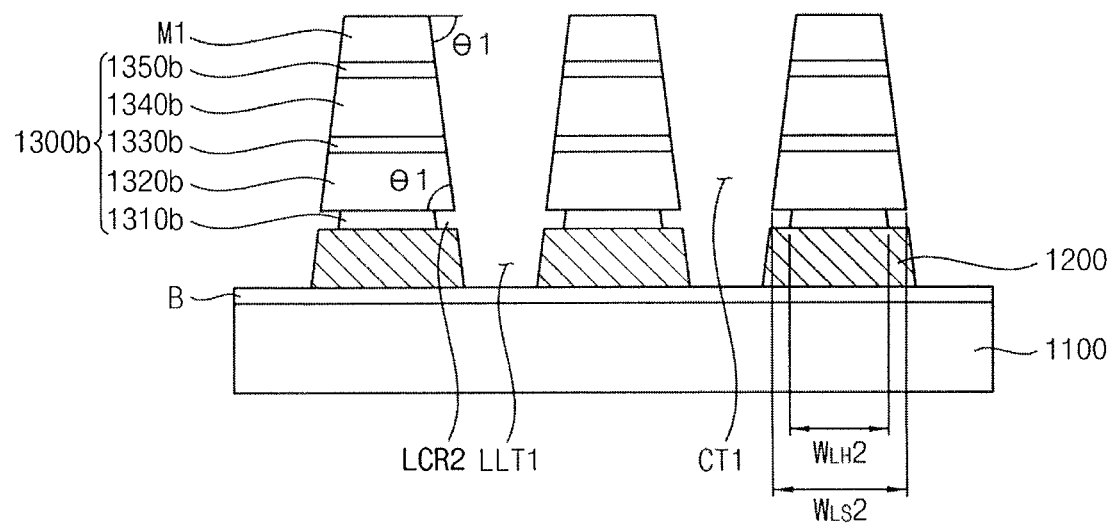

Referring to FIGS. 13A and 13B, the first lower electrode line 1310b may be further etched off along the second direction y by an isotropic etching process, thus the width of the first lower electrode line 1310b along the second direction y may be reduced to a second reduced width $W_{LH}2$ that may be smaller than a second width $W_{LS}2$ of the first selection line 1320b.

Accordingly, a second lower cell recess LCR2 may be formed between the lower conductive line 1200 and the first selection line 1320b in such a way that the second lower cell recess LCR2 may be defined by the side surfaces of the first lower electrode line 1310b, the upper surface of the lower conductive line 1200 and the lower surface of the first selection line 1320b and may communicate with the first cell trench CT1. Therefore, the insulation space between the neighboring first cell lines may be enlarged as much as the size of the second lower cell recess LCR2.

In the present example embodiment, the second reduced width $W_{LH}2$ of the first lower electrode line 1310b may be about ¼ to about ½ times the second width $W_{LS}2$ of the first selection line 1320b.

The isotropic etching process for forming the second lower cell recess LCR2 may be controlled in such a way that the first lower electrode line 1310b may have a sufficient etching selectivity with respect to the first selection line 1320b, the second lower electrode line 1330b, the first data storage line 1320b and the third lower electrode line 1350b.

Figure 14A:
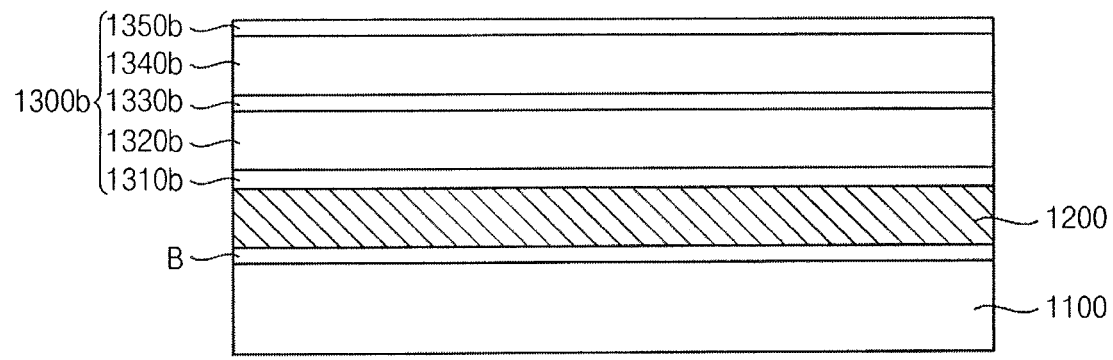
Figure 14B:
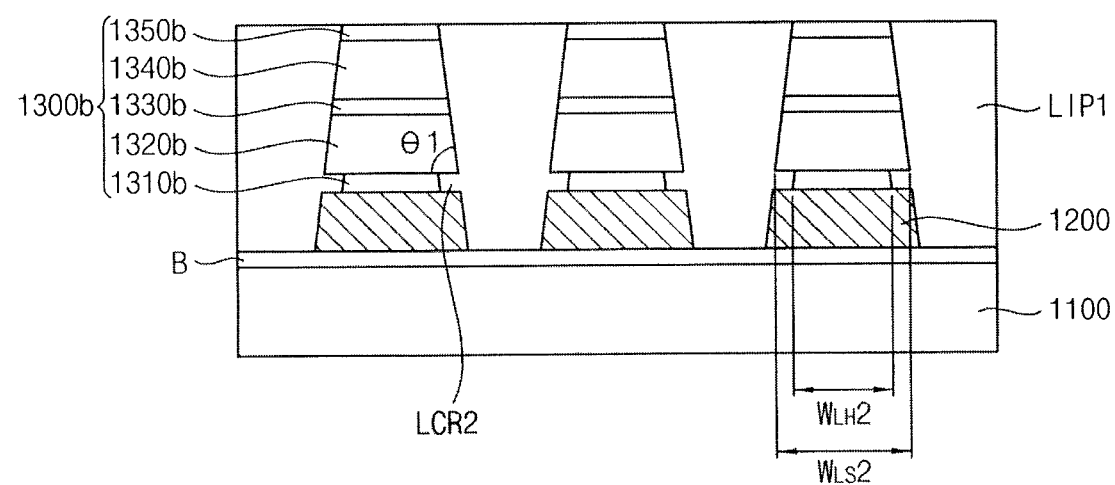

Referring to FIGS. 14A and 14B, the first lower insulation pattern LIP1 may be formed in the first cell trench CT1 and the first lower line trench LLT1, thereby separating the neighboring first cell lines 1300b and the neighboring lower conductive lines 1200 along the second direction y.

For example, an insulation layer (not shown) may be formed on the buffer layer B to a sufficient thickness to fill up the first cell trench CT1 and the first lower line trench LLT1, and then may be planarized until the upper surface of the first cell line 1300b may be exposed. Thus, the insulation layer may remain just in the first cell trench CT1 and the first lower line trench LLT1, thereby forming the first lower insulation pattern LIP1.

Since the first lower line trench LLT1 and the first cell trench CT1 may be simultaneously with the same insulation materials, the first cell lines 1300b and the lower conductive lines 1200 may be separated from one another by a single insulation pattern of the first lower insulation pattern LIP1. Examples of the first lower insulation pattern LIP1 may include silicon oxide, silicon nitride and silicon oxynitride.

Figure 15A:
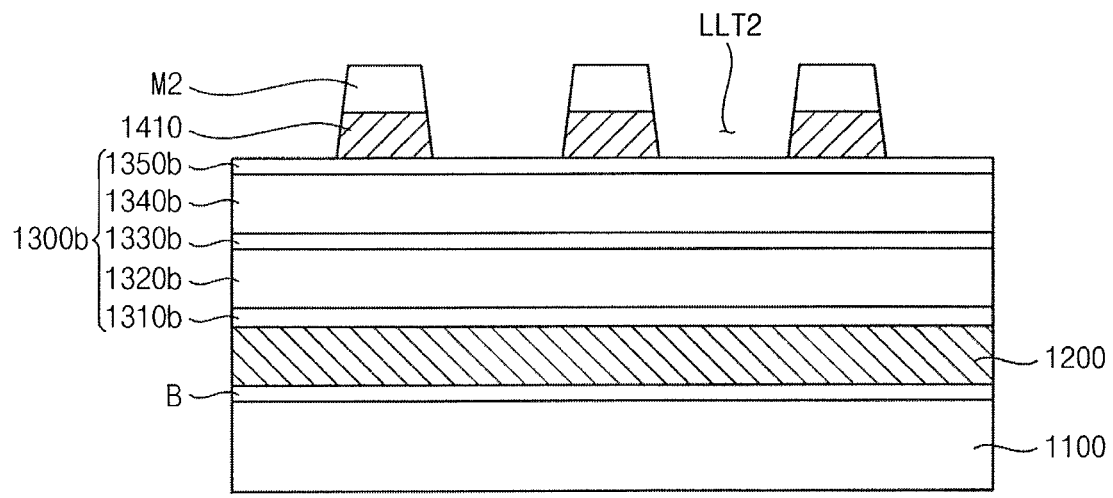
Figure 15B:
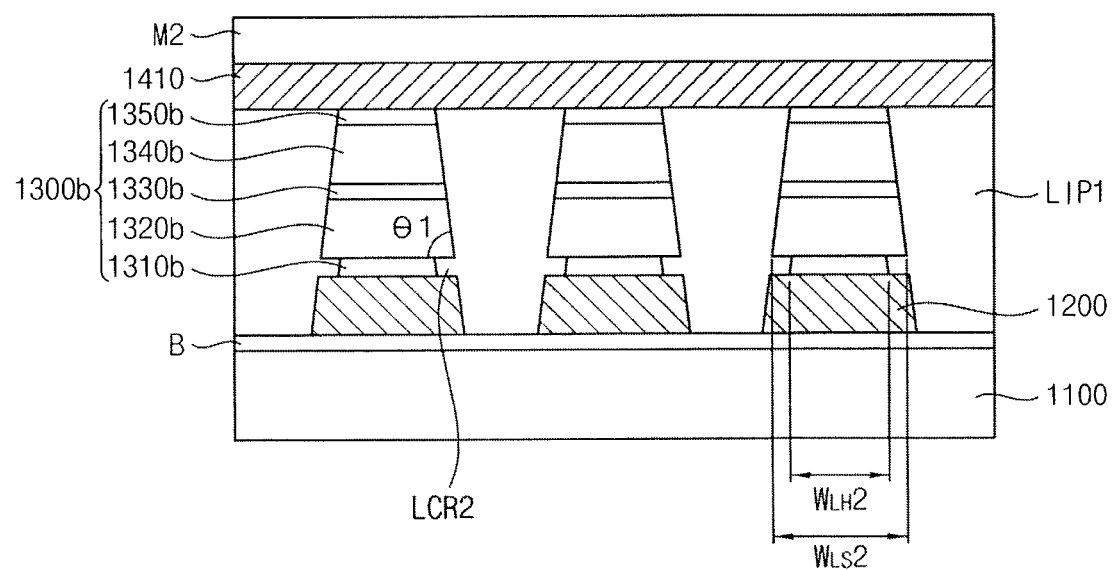

Referring to FIGS. 15A and 15B, a first component line 1410 may be formed on the first cell line 1300b and the first lower insulation pattern LIP1 in such a way that the width of the first component line 1410 along the first direction x may be reduced upwards.

For example, low-resistive metals may be deposited on the first cell line 1300b and the first lower insulation pattern LIP1, thereby forming a first component layer (not shown) on the first cell line 1300b and the first lower insulation pattern LIP1.

Examples of the low-resistive metals for the first component layer may include tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), etc. These may be used alone or in combinations thereof. Particularly, the first component layer may include the same materials as the lower conductive line 1200.

Then, a second mask pattern M2 may be formed on the first component layer. The second mask pattern may include a plurality of lines extending in the second direction y and spaced apart along the first direction x.

Thereafter, the first component layer may be partially removed off by an anisotropic etching process using the second mask pattern M2 as an etching mask until the first cell line 1300b and the first lower insulation pattern LIP1 may be exposed, thereby forming a second lower line trench LLT2 extending in the second direction y. Particularly, the first component layer may be partially etched off under the etching conditions that the second lower line trench LLT2 may be reduced downwards and side walls of the second lower line trench LLT2 may be slanted at a second slant angle θ2, e.g., relative to the first direction x. The second slant angle θ2 may be different from or the same as the first slant angle θ1. Accordingly, the first component layer may be formed into the first component layer 1410 that may be shaped into a trapezoidal line extending in the second direction y.

Since the second lower line trench LLT2 may be shaped into a trapezoidal line extending in the second direction y, the first cell line 1300b and the first lower insulation pattern LIP1 may be alternately exposed through the second lower line trench LLT2 along the second direction y.

In the present example embodiment, the first component line 1410 may be formed by a reactive ion etching (RIE) process.

Figure 16A:
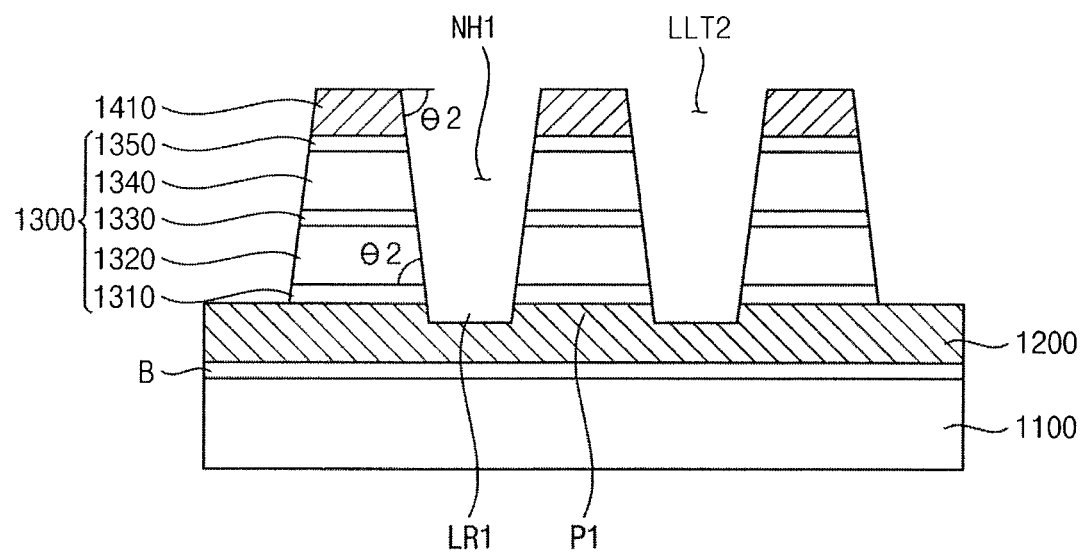
Figure 16B:
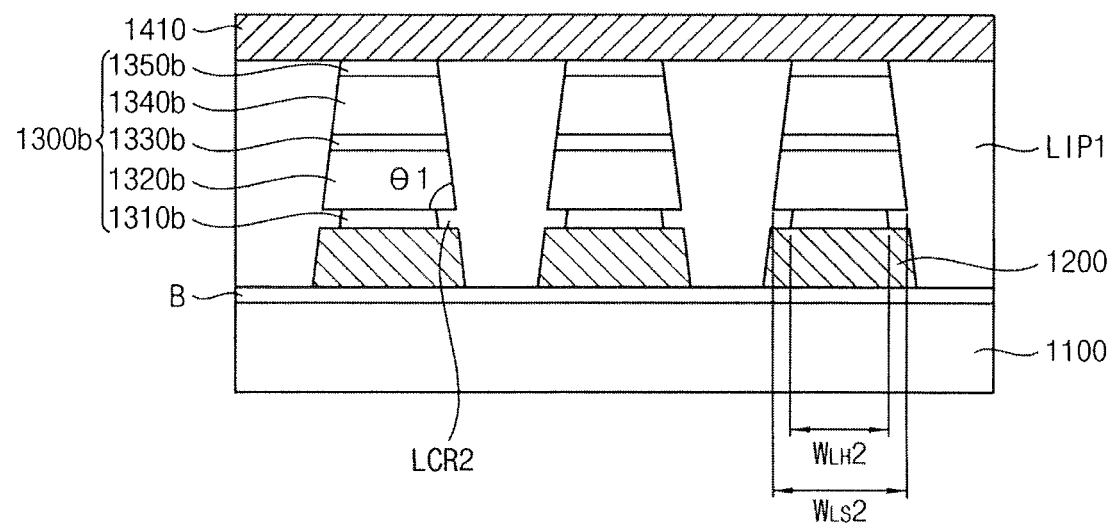

Referring to FIGS. 16A and 16B, the first cell line 1300b that may be exposed through the second lower line trench LLT2 may be partially removed from the buffer layer B, to thereby form a first node separation hole NH1 through which the lower conductive line 1200 may be exposed. The first cell structures 1300 may be positioned at each of the first cross points C1 of the lower conductive line 1200 and the first component line 1410.

Particularly, since the first cell line 1300b may include metal-based material similar to the first component line 1410, the first cell line 1300b may be consecutively etched off after formation of the second lower line trench LLT2 and the first component line 1400 just by changing the process conditions such as etching gases and a process temperature and pressure. In the above etching process, the process conditions may be individually adjusted to each of the first to third lower electrode lines 1310b, 1330b and 1350b, the first selection line 1320b and the first data storage line 1320b in such a way that the contact resistance therebetween may be reduced.

Thus, the first cell line 1300b may be separated by the first node separation hole NH1 in the first direction x as well as be separated by the first lower insulation pattern LIP1 in the second direction y, so that the first cell line 1300b may be node-separated into a plurality of the first cell structures 1300.

That is, the first cell line 1300b may be formed into the first cell structure 1300 having a first lower electrode 1310, a first selection element 1320, a second lower electrode 1330, a first data storage element 1340 and a third lower element 1350 by the etching process for forming the first node separation hole NH1. In addition, an upper surface of the lower conductive line 1200 may be exposed through the first node separation hole NH1.

For example, the first node separation hole NH1 and the second lower line trench LIT2 may be formed by a single etching process in the same etching chamber just by controlling the etching conditions.

The first component layer and the first cell line 1310b may be partially etched off by an anisotropic etching process under the etching conditions that the second lower line trench LLT2 and the first node separation hole NH1 may be reduced downwards and side walls of the second lower line trench LLT2 and the first node separation hole NH1 may be continuous and slanted at the second slant angle θ2.

Accordingly, the first component line 1410 and the first cell structure 1300 may be formed into a single trapezoid in such a way that the side surface of the first cell structure 1300 and the first component line 1410 may be coplanar with each other in the same trapezoid.

For example, the second slant angle θ2 of the trapezoid may be in a range of about 70° to about 85° with respect to an upper surface of the first component line 1410 like the first slant angle θ1, so that the trapezoid of the first cell structure 1300 and the first component line 1410 may have a base angle of about 70° to about 85°.

In a modified example embodiment, the lower conductive line 1210 exposed through the first node separation hole NH1 may be partially recessed, thereby forming a plurality of the first line recess LR1 on the lower conductive line 1200. Thus, the lower conductive line 1210 may be formed into an uneven structure in which the first line recesses LR1 and first protrusions P1 may be alternately arranged at an upper portion thereof. The first protrusion P1 may be defined by the first recesses LR1 and the first cell structure 1300 may be arranged on the first protrusion P1.

The lower conductive line 1200 may be partially removed by a dry or a wet etching process having an etching selectivity with respect to the first cell structure 1300 and the first component line 1410.

The thermal cross talk between the neighboring first cell structures 1300 on the lower conductive line 1200 may be sufficiently reduced due to the depth of the first line recess LR1, thereby improving the operation reliability and stability of the semiconductor memory device 2000.

Figure 17A:
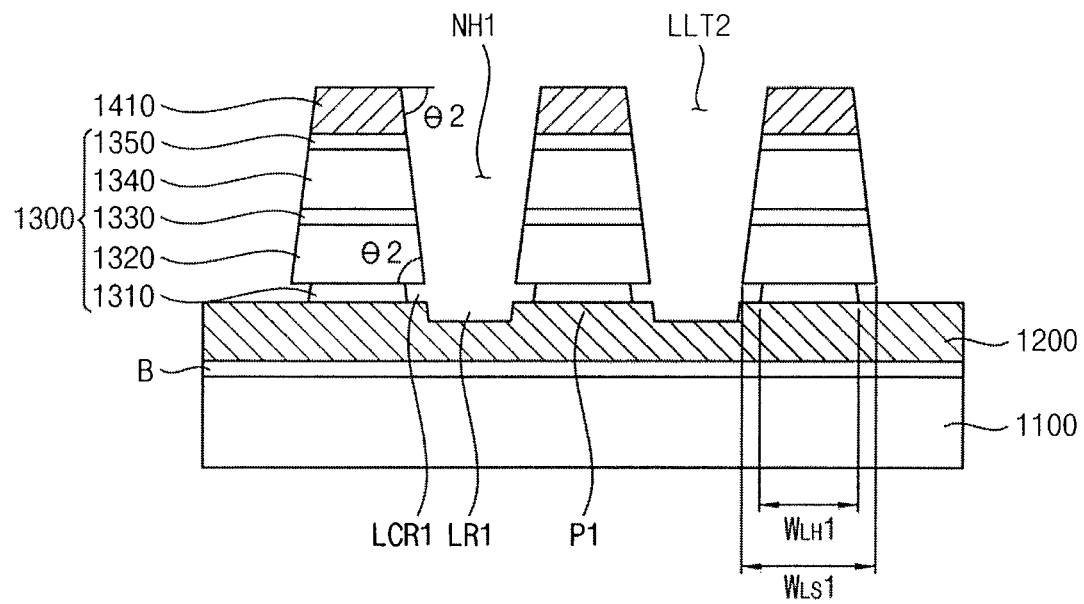
Figure 17B:
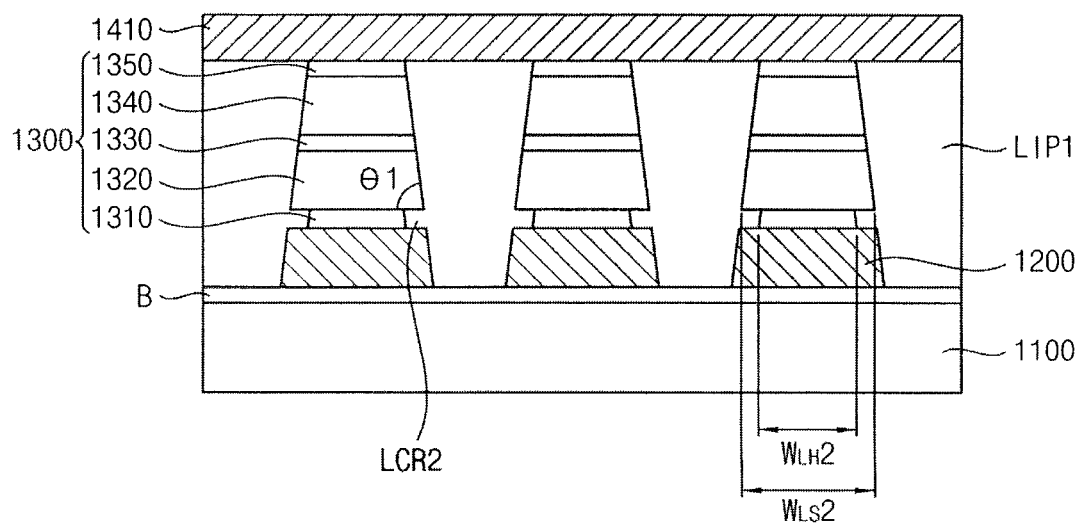

Referring to FIGS. 17A and 17B, the first lower electrode 1310 may be further etched off along the first direction x by an isotropic etching process, thus the width of the first lower electrode 1310 along the first direction x may be reduced to a first reduced width $W_{LH}1$ that may be smaller than a first width $W_{LS}1$ of the first selection element 1320.

Accordingly, a first lower cell recess LCR1 may be formed between the lower conductive line 1200 and the first selection element 1320 in such a way that the first lower cell recess LCR1 may be defined by the side surfaces of the first lower electrode 1310, the upper surface of the lower conductive line 1200 and the lower surface of the first selection element 1320 and may communicate with the first node separation hole NH1. Therefore, the insulation space between the neighboring first cell structures 1300 may be enlarged as much as the size of the first lower cell recess LCR1.

In the present example embodiment, the first reduced width $W_{LH}1$ of the first lower electrode 1310 may be about ¼ to about ½ times the first width $W_{LS}1$ of the first selection element 1320.

The isotropic etching process for forming the first lower cell recess LCR1 may be controlled in such a way that the first lower electrode 1310 may have a sufficient etching selectivity with respect to the first selection element 1320, the second lower electrode 1330, the first data storage element 1340 and the third lower electrode 1350.

The positions of the first and the second lower line recesses LCR1 and LCR2 may be varied according to the stack structure of the first cell structure 1300, as described in detail with reference to FIGS. 5A to 6B.

For example, when the first multilayer 1300a may be formed in such a way that the first lower electrode layer 1310a may be interposed between the first selection layer 1320a and the first data storage layer 1340a, the first and second lower cell recesses LCR1 and LCR2 may be defined by the first selection element 1320 and the first data storage element 1340.

In the same way, when the first multilayer 1300a may be formed in such a way that the third lower electrode layer 1350a, the first data storage layer 1340a, the second lower electrode layer 1330a, the first selection layer 1320a and the first lower electrode layer 1310a may be sequentially stacked on the lower conductive layer 1200a and the first lower electrode layer 1310a may be interposed between the first selection layer 1320a and the first component layer, the first and second lower cell recesses LCR1 and LCR2 may be defined by the first selection element 1320 and the first component line 1410.

Figure 18A:
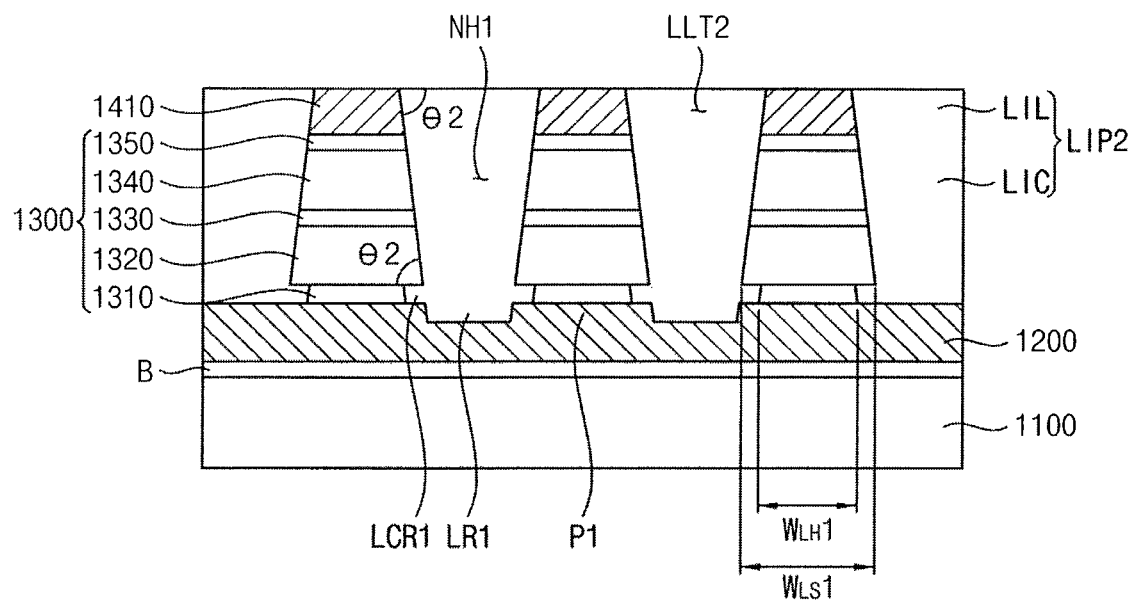
Figure 18B:
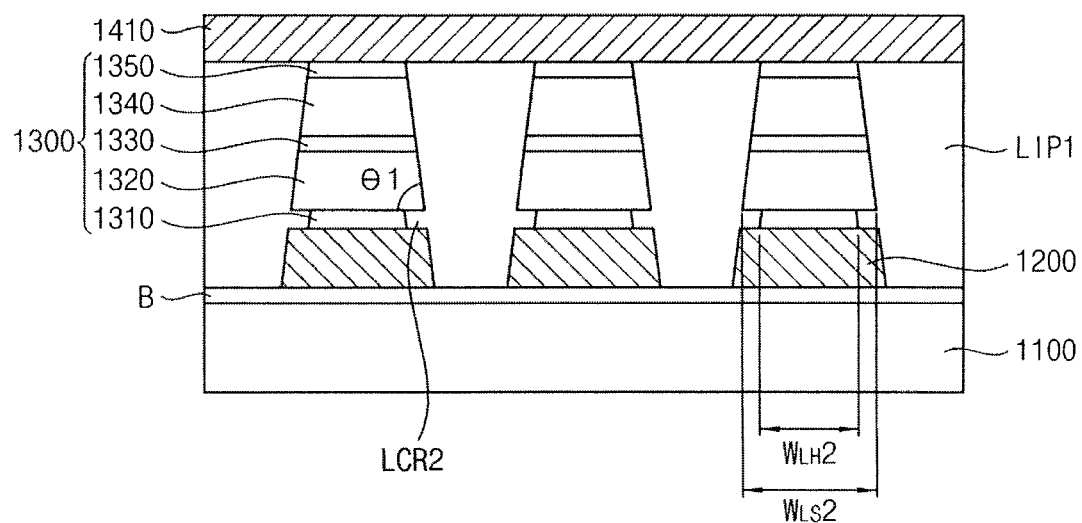

Referring to FIGS. 18A and 18B, a lower insulation column LIC for insulating the first cell structures 1300 may be formed in the first node separation hole NH1 and a lower insulation line LIL for separating the first component lines 1410 may be formed in the second lower line trench LLT2, thereby forming a second lower insulation pattern LIP2.

For example, an insulation layer (not shown) may be formed to a sufficient thickness to fill up the second lower line trench LLT2 and the first node separation hole NH1 by a deposition process. Then, the insulation layer may be planarized by a planarization process until an upper surface of the first component line 1410 may be exposed, thereby simultaneously forming the lower insulation column LIC and the lower insulation line LIL. The second lower insulation pattern LIP2 may include one of silicon oxide, silicon nitride and silicon oxynitride.

While the present example embodiment discloses that the lower insulation line LIL may include the same insulation materials as the lower insulation column LIC in the same process, the lower insulation column LIC and the lower insulation line LIL may be individually formed in different processes with different insulation materials.

Accordingly, the first cell structures 1300 on the first protrusion P1 may be separated by the lower insulation column LIC of which the bottom may be lower than a bottom surface of the first cell structure 1300. Thus, the thermal cross talk between neighboring memory cells may be reduced, thereby increasing the operation reliability of the semiconductor memory device 2000.

Figure 19A:
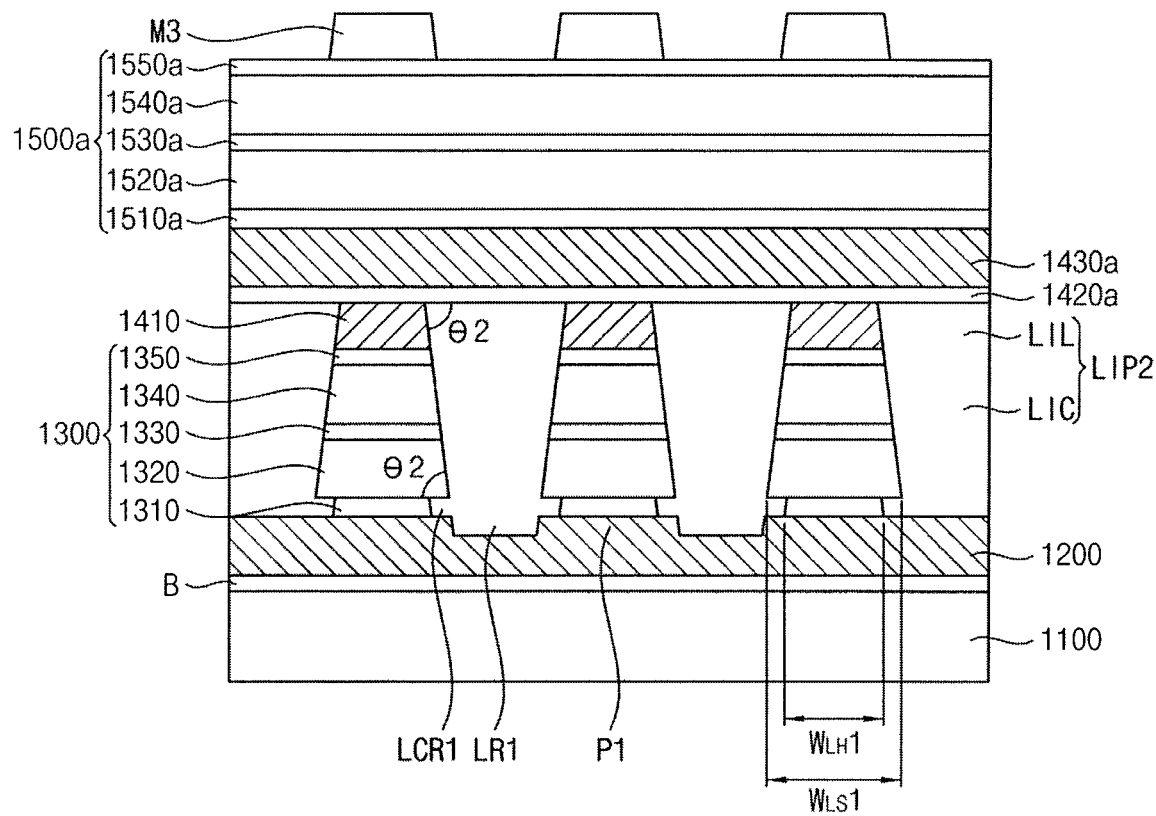
Figure 19B:
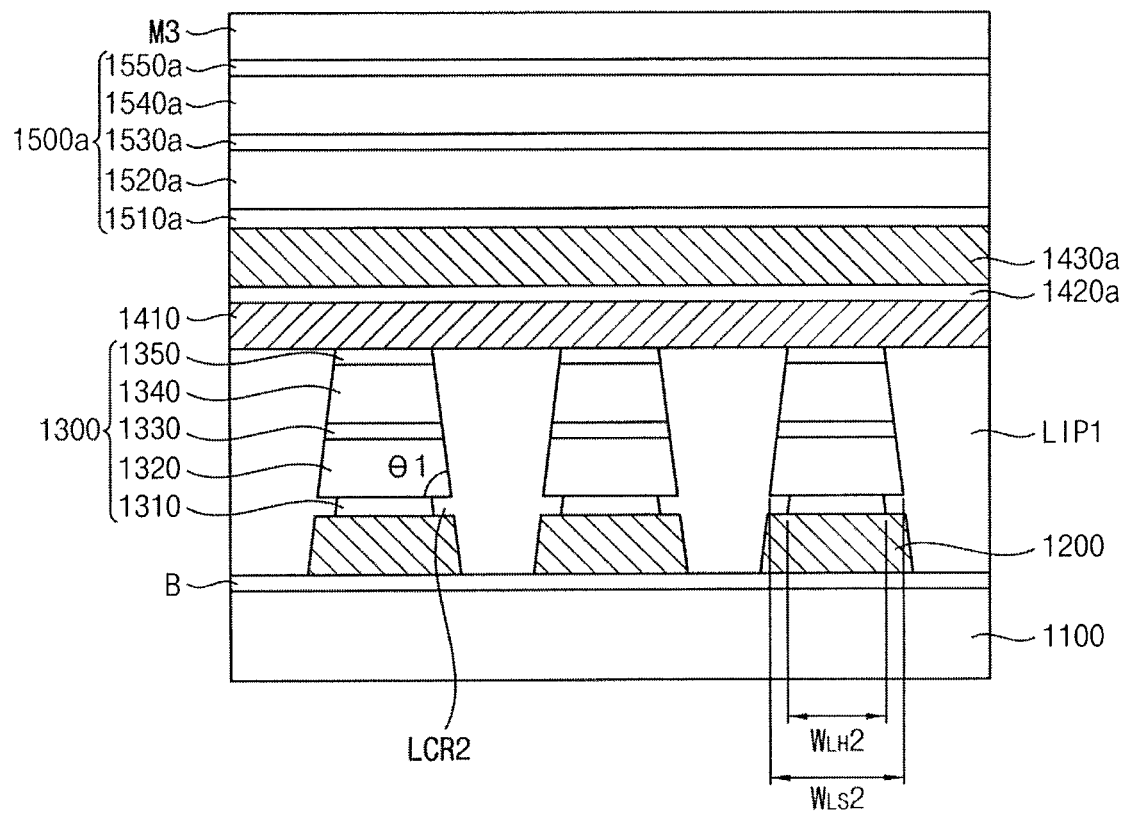

Referring to FIGS. 19A and 19B, a separation layer 1420a, a second component layer 1430a and a second multilayer 1500a may be formed on the first component line 1410 and the lower insulation line LIL.

The same metal as the first component line 1410 may be formed on a whole surface of the first component line 1410 and the lower insulation line LIL and a silicidation process may be conducted to the metal, thereby forming a metal silicide layer on the first component line 1410 and the lower insulation line LIL as the separation layer 1420a. Then, the second component layer 1430a may be formed on the metal silicide layer by a deposition process such as a chemical vapor deposition (CVD) process and a physical vapor deposition (PVD) process.

Thereafter, the first upper electrode layer 1510a, the second selection layer 1520a, the second upper electrode layer 1530a, the second data storage layer 1540a and the third upper electrode layer 1550a may be sequentially formed on the second component layer 1430a, thereby forming the second multilayer 1500a on the second component layer 1430a.

The second multilayer 1500a may include the same materials and structures as the first multilayer 1300a and may be formed into the second cell structures 1500 in a subsequent process.

Then, a third mask pattern M3 may be formed on the second multilayer 1500a. The third mask pattern M3 may be formed into a plurality of lines extending in the second direction y and spaced apart along the first direction x.

The second multilayer 1500a may be formed by the same process as for the first multilayer 1300a described in detail with reference to FIGS. 11A and 11B and the third mask pattern M3 may be formed by the same process as for the second mask pattern M2 described in detail with reference to FIGS. 13A and 13B.

Figure 20A:
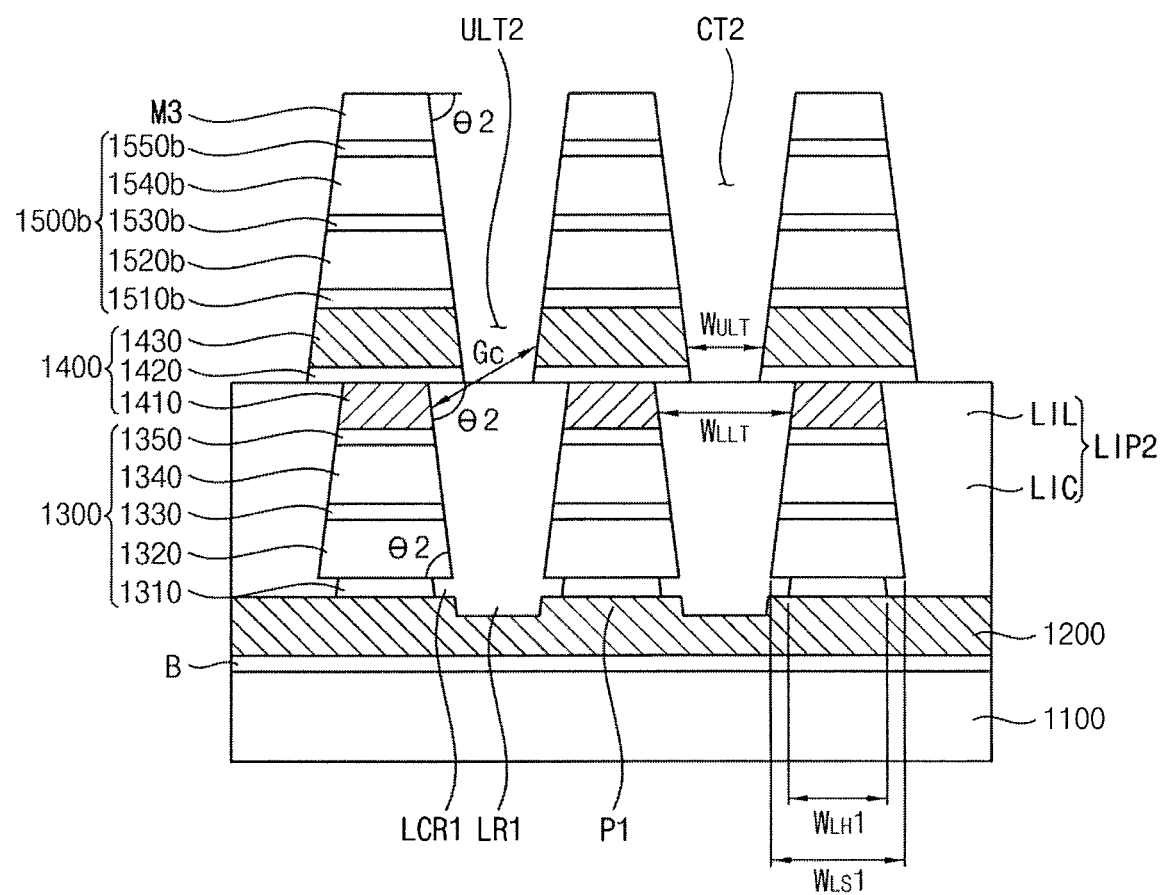
Figure 20B:
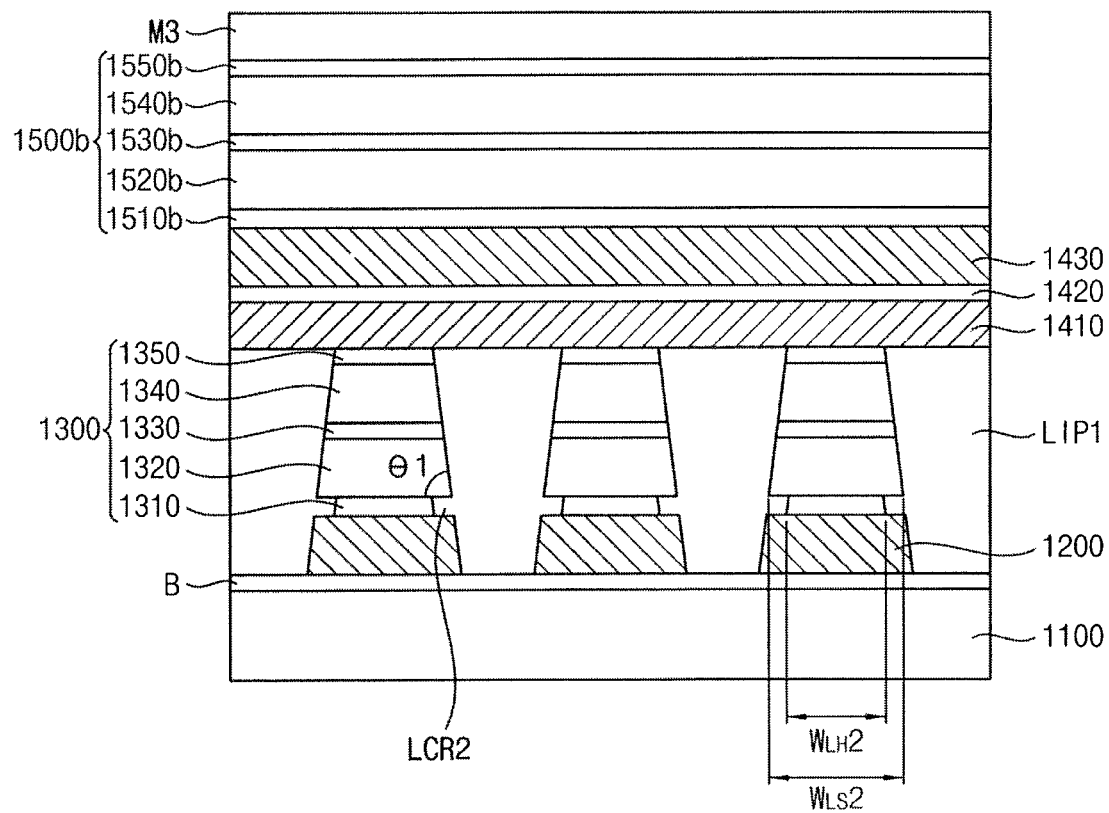

Referring to FIGS. 20A and 20B, the second multilayer 1500a may be partially removed into a line shape by an etching process using the third mask pattern M2 as an etching mask, thereby forming a second cell trench CT2 and a second upper line trench ULT2 that may extend in the second direction y. Thus, the second multilayer 1500a may be formed into a plurality of second cell lines 1500b that may extend in the second direction y and spaced apart by the second cell trench CT2 along the first direction x. In addition, the separation layer 1420a and the second component layer 1430a may be formed into a separation line 1420 and the second component line 1430, respectively. Particularly, the separation line 1420, the second component line 1430 and the second cell line 1500b may be formed into a single trapezoid.

For example, the second multilayer 1500a may be etched into the line shape, thereby forming the second cell trench CT2 through which the second component layer 12430a may be exposed and forming the second cell lines 1500b in which a first upper electrode line 1510b, a second selection line 1520b, a second upper electrode line 1530b, a second data storage line 1540b and a third upper electrode line 1550b may be stacked on the second component layer 1430a just like the first cell lines 1300b. Then, the second component layer 1430a and the separation layer 1420a may be consecutively etched into the line shape, thereby forming the second upper line trench ULT2 that may communicate with the second cell trench CT2 and forming the second component line 1430 and the separation line 1420 on the first component line 1410.

Particularly, the second cell trench CT2 and the second upper line trench ULT2 may be continuously formed by the consecutive etching processes, so the separation line 1420, the second component line 1430 and the second cell line 1500b may be shaped into a single shape.

The second multilayer 1500a, the second component layer 1430a and the separation layer 1420a may be partially removed into the line shape by an anisotropic etching process under etching conditions that the second cell trench CT2 and the second upper line trench ULT2 may be reduced downwards and side walls of the second cell trench CT2 and the second upper line trench ULT2 may be continuous and slanted at the second slant angle θ2.

Accordingly, the separation line 1420, the second component line 1430 and the second cell line 1500b may be formed into a single trapezoid on the first component line 1410 in such a way that the side surfaces of the second cell line 1500b, the second component line 1430 and the separation line 1420 may be coplanar with one another in the same trapezoid.

When the second cell trench CT2 and the second upper line trench ULT2 may be reduced at the same slant angle with the second lower line trench LLT2 and the first node separation hole NH1, the second upper line trench ULT2 may constitute a lower portion of an upper reverse trapezoid and the second lower line trench LLT2 may constitute an upper portion of a lower reverse trapezoid. As a result, the width $W_{ULT}$ of the second upper line trench ULT2 may be smaller than the width $W_{LLT}$ of the second lower line trench LLT2 and the width of the first component line 1410 may be greater than the width of the second component line 1430.

The first component line 1410 may function as a bit line for the first memory stack MC1 and the second component line 1430 may function as a bit line for the second memory stack MC2. Thus, the stack structure of the first and the second component lines 1410 and 1430 in a medium of the separation line 1420 may be formed into the middle conductive line 1400 and be provided as a common bit line for the semiconductor memory device 2000.

Thus, the cross gap Gc of the middle conductive line 1400 between the neighboring first and the second memory stacks MC1 and MC2 may increase by as much as the difference between the width $W_{ULT}$ of the second upper line trench ULT2 and the width $W_{LLT}$ of the second lower line trench LLT2, and the insulation space between the neighboring middle conductive lines 1400 may be maximized due to the trapezoidal shape of the first and the second cell structures 1300 and 1500. The increase of the insulation space may result in the increase the widths of the second lower insulation pattern LIP2 and a second upper insulation pattern UIP2, thereby increasing the breakdown voltage margin between the first and the second memory stacks MC1 and MC2 adjacent to each other.

In addition, the increase of the width $W_{LLT}$ of the second lower line trench LLT2 may improve the aligning margin of a photolithography process for forming the third mask pattern M3, thereby reducing the misalignment between the second upper line trench ULT2 and the second lower line trench LLT2.

For example, the second slant angle θ2 of the second cell trench CT2 and the second upper line trench ULT2 may be in a range of about 70° to about 85° with respect to an upper surface of the second cell line 1500b, so that the trapezoid of the second cell line 1500b, the second component line 1430 and the separation line 1420 may have a base angle of about 70° to about 85°.

Figure 21A:
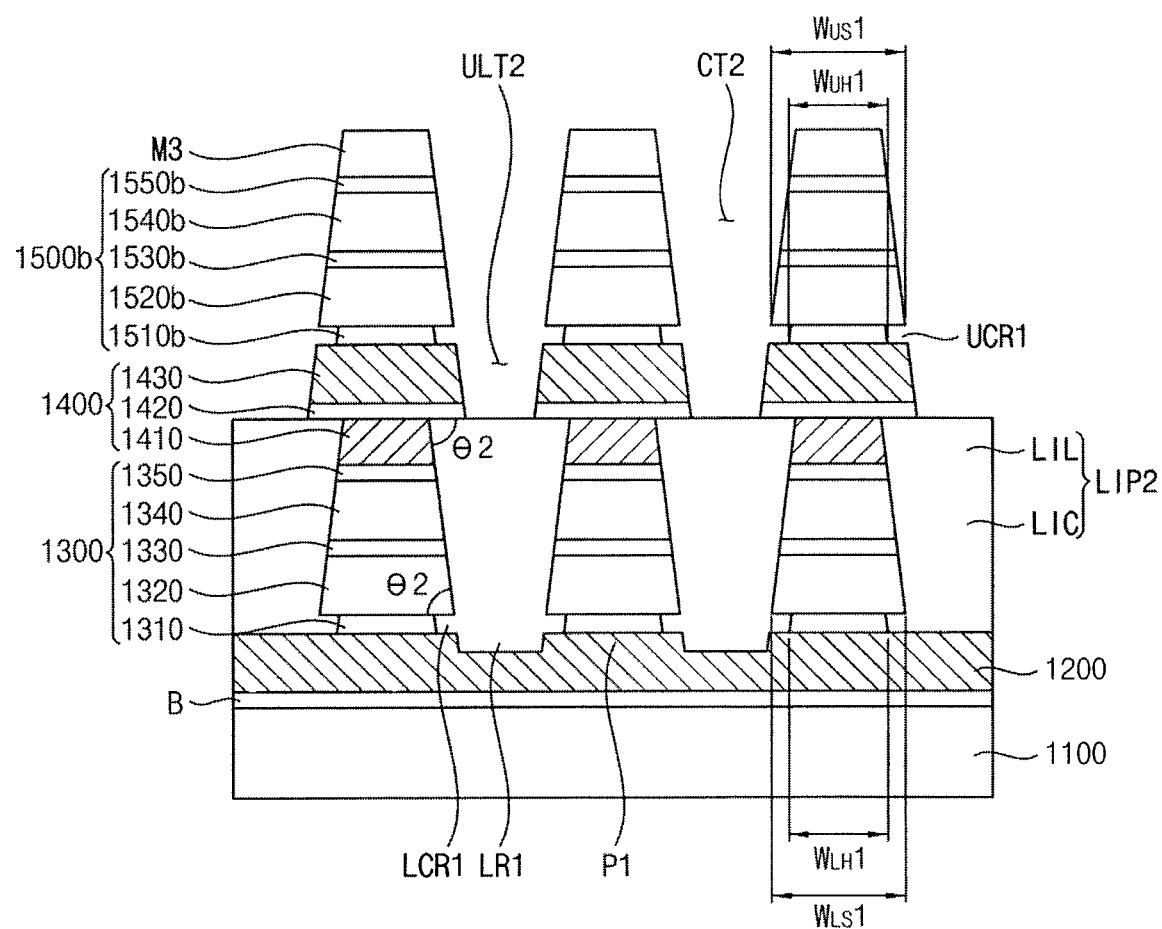
Figure 21B:
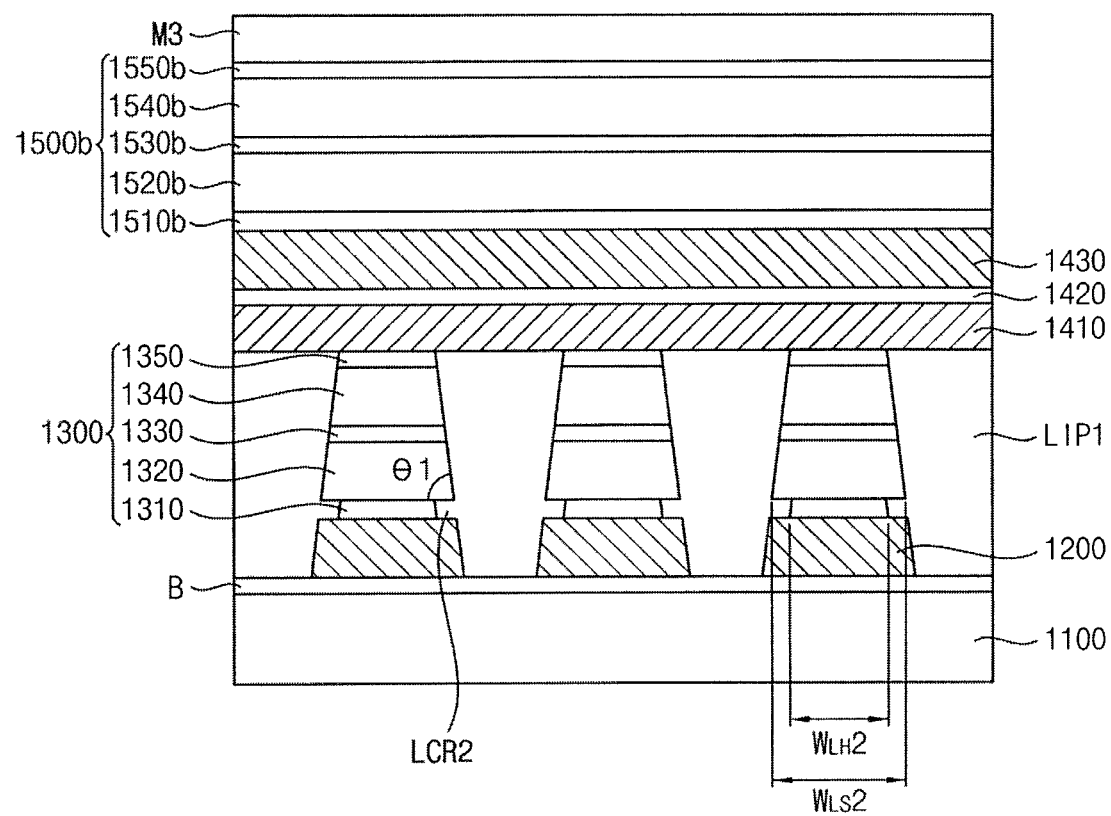

Referring to FIGS. 21A and 21B, the first upper electrode line 1510b may be further etched off along the first direction x by an isotropic etching process, thus the width of the first upper electrode line 1510b along the first direction x may be reduced to a first reduced width $W_{UH}1$ that may be smaller than a first width $W_{US}1$ of the second selection line 1520b.

Accordingly, a first upper cell recess UCR1 may be formed between the seconds component line 1430 and the second selection line 1520b in such a way that the first upper cell recess UCR1 may be defined by the side surfaces of the first upper electrode line 1510b, the upper surface of the second component line 1430 and the lower surface of the second selection line 1520b and may communicate with the second cell trench CT2. Therefore, the insulation space between the neighboring second cell lines 1500b may be enlarged as much as the size of the first upper cell recess UCR1.

In the present example embodiment, the first reduced width $W_{UH}1$ the first upper electrode line 1510b may be about ¼ to about ½ times the first width $W_{US}1$ of the second selection line 1520b.

The isotropic etching process for forming the first upper cell recess UCLR1 may be controlled in such a way that the first upper electrode line 1510b may have a sufficient etching selectivity with respect to the second selection line 1520b, the second upper electrode line 1530b, the second data storage line 1540b and the third upper electrode line 1550b.

Figure 22A:
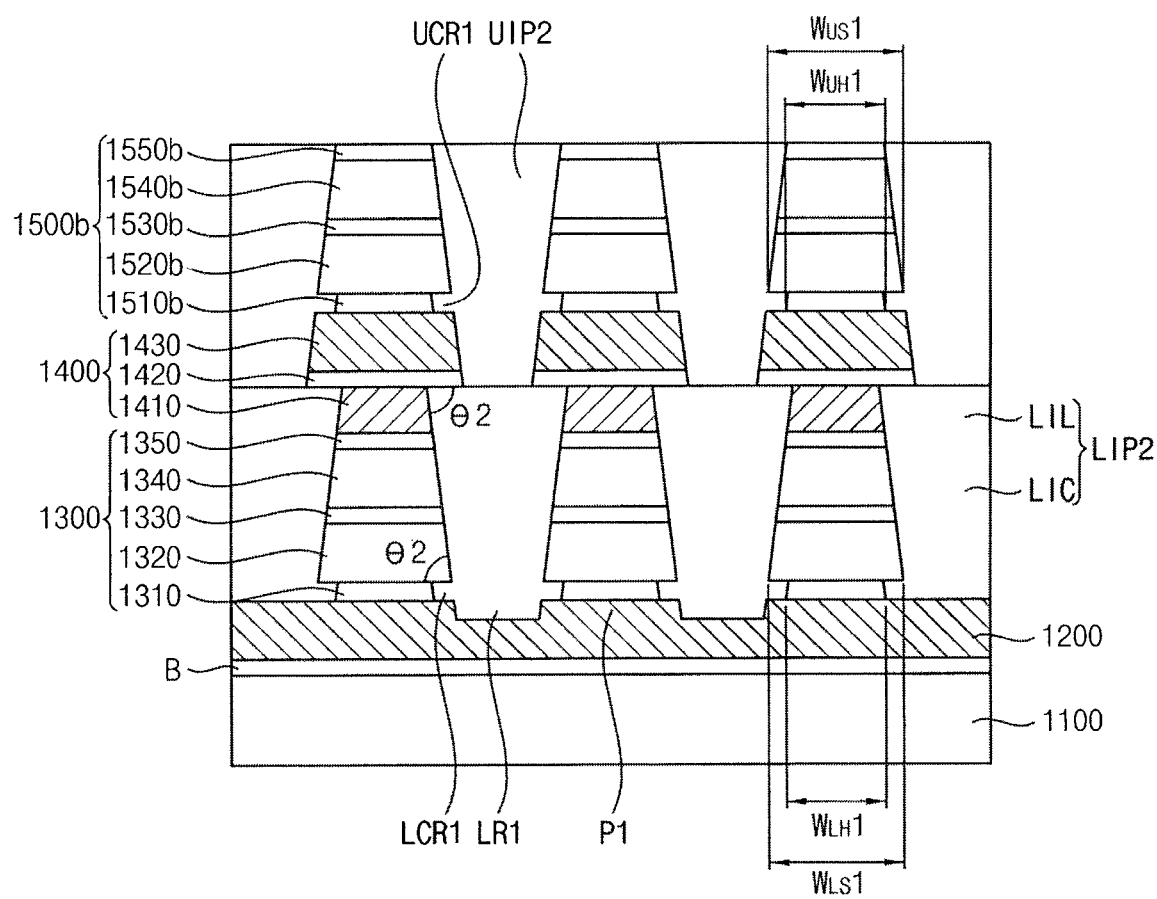
Figure 22B:
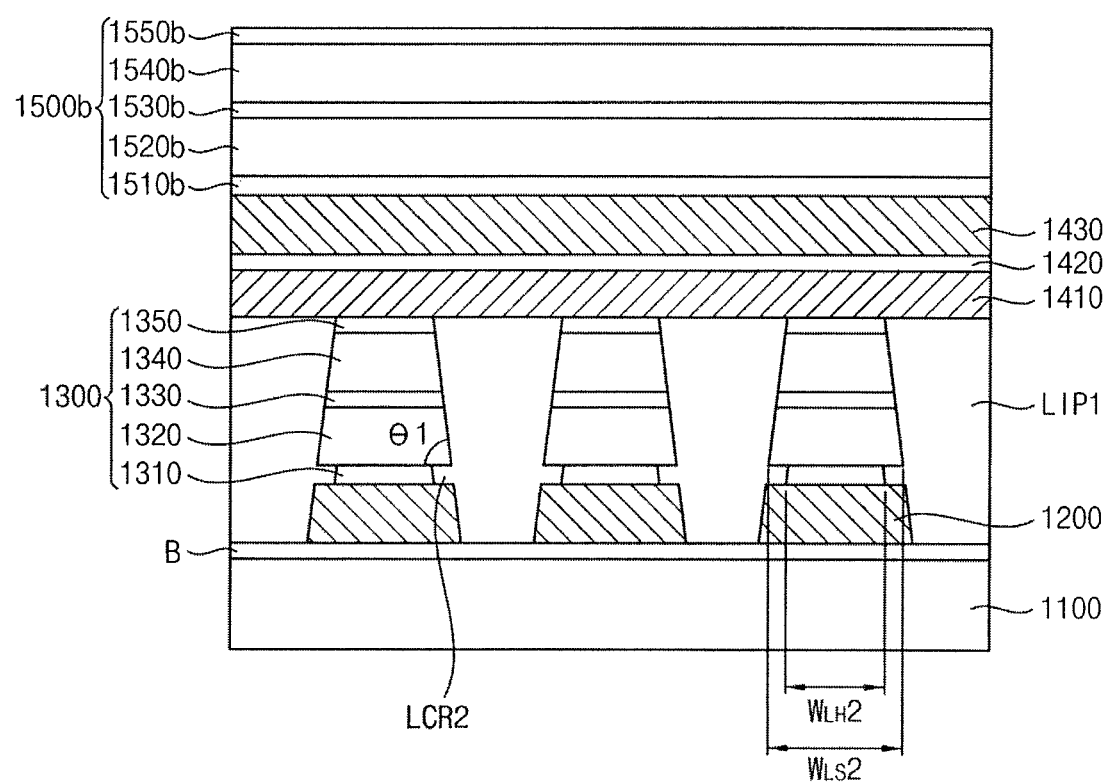

Referring to FIGS. 22A and 22B, the second upper insulation pattern UIP2 may be formed in the second cell trench CT2 and the second upper line trench ULT2, thereby separating the neighboring second cell lines 1500b, the neighboring second component lines 1430 and the neighboring separation lines 1420 along the second direction y.

For example, an insulation layer (not shown) may be formed to a sufficient thickness to fill up the second cell trench CT2 and the second upper line trench ULT2, and then may be planarized until the upper surface of the second cell line 1500b may be exposed. Thus, the insulation layer may remain just in the second cell trench CT2 and the second upper line trench ULT2, thereby forming the second upper insulation pattern UIP2.

Since the second upper line trench ULT2 and the second cell trench CT2 may be simultaneously with the same insulation materials, the second cell lines 1500b, the second component lines 1430 and the separation lines 1420 may be separated from one another by a single insulation pattern of the second upper insulation pattern UIP2. Examples of the second upper insulation pattern UIP2 may include silicon oxide, silicon nitride and silicon oxynitride.

Figure 23A:
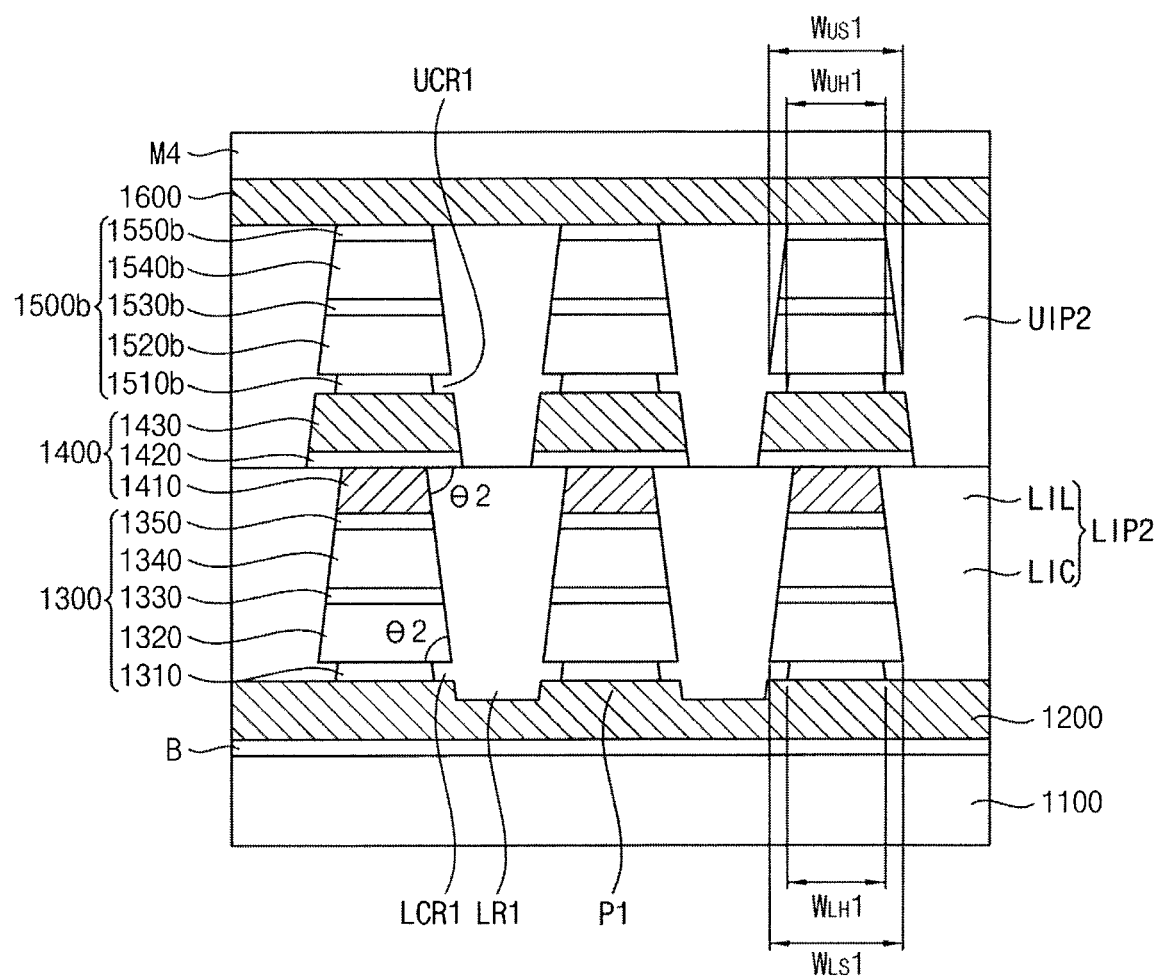
Figure 23B:
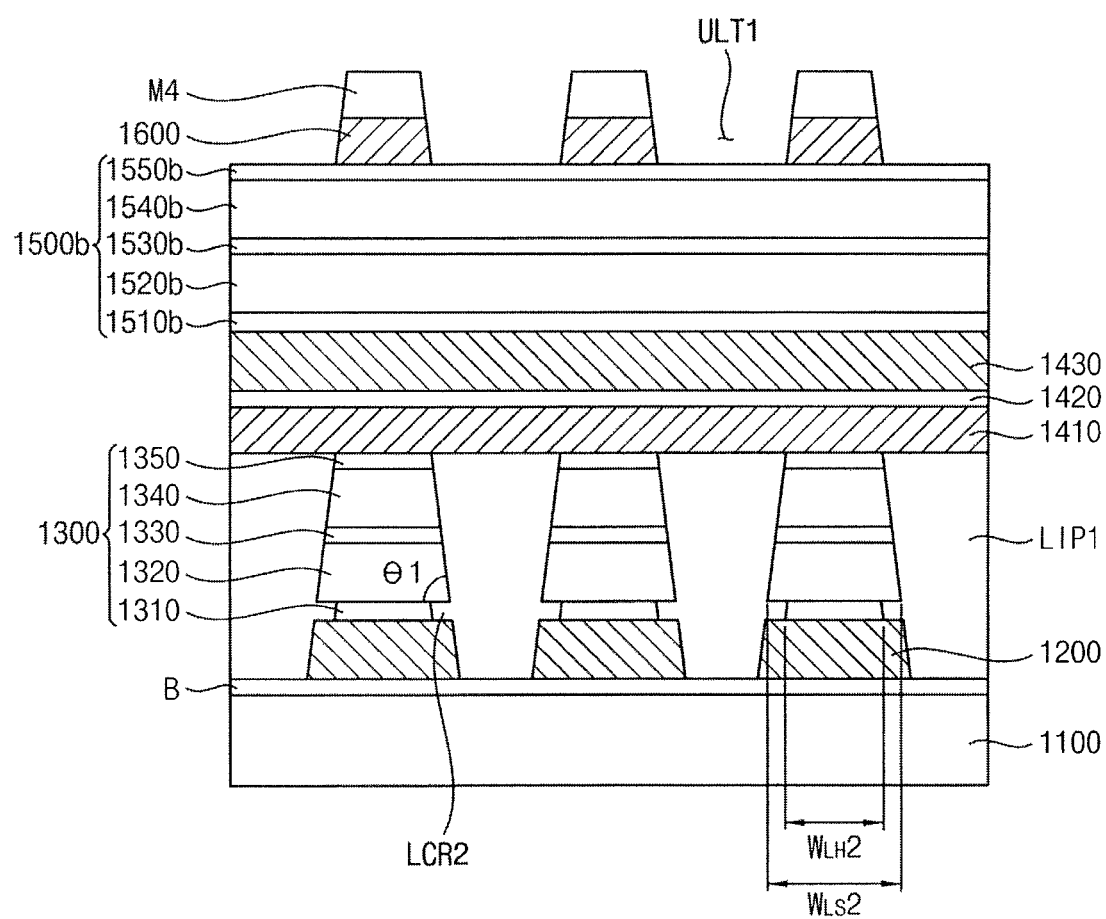

Referring to FIGS. 23A and 23B, an upper conductive line 1600 may be formed on the second cell line 1500b and the second upper insulation pattern UIP2 in such a way that the width of the upper conductive line 1600 along the second direction y may be reduced upwards.

For example, low-resistive metals may be deposited on the second cell line 1500b and the second upper insulation pattern UIP2, thereby forming an upper conductive layer (not shown) on the second cell line 1500b and the second upper insulation pattern UIP2.

Examples of the low-resistive metals for the upper conductive layer may include tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), etc. These may be used alone or in combinations thereof. Particularly, the first component layer may include the same materials as the lower conductive line 1200.

Then, a fourth mask pattern M4 may be formed on the upper conductive layer. The fourth mask pattern M4 may include a plurality of lines extending in the first direction x and spaced apart along the second direction y.

Thereafter, the upper conductive layer may be partially removed off by an anisotropic etching process using the fourth mask pattern M4 as an etching mask until the second cell line 1500b and the second upper insulation pattern UIP2 may be exposed, thereby forming a first upper line trench ULT1 extending in the first direction x. Particularly, the upper conductive layer may be partially etched off under the etching conditions that the first upper line trench ULT1 may be reduced downwards and side walls of the first upper line trench ULT1 may be slanted at a first slant angle θ1. The first slant angle θ1 may be different from or the same as the second slant angle θ2. Accordingly, the upper conductive layer may be formed into the upper conductive line 1600 that may be shaped into a trapezoidal line extending in the first direction x.

Since the first upper line trench ULT1 may be shaped into a trapezoidal line extending in the first direction x, the second cell line 1500b and the second upper insulation pattern UIP2 may be alternately exposed through the first upper line trench ULT1 along the first direction x.

In the present example embodiment, the upper conductive line 1600 may be formed by a reactive ion etching (RIE) process.

Figure 24A:
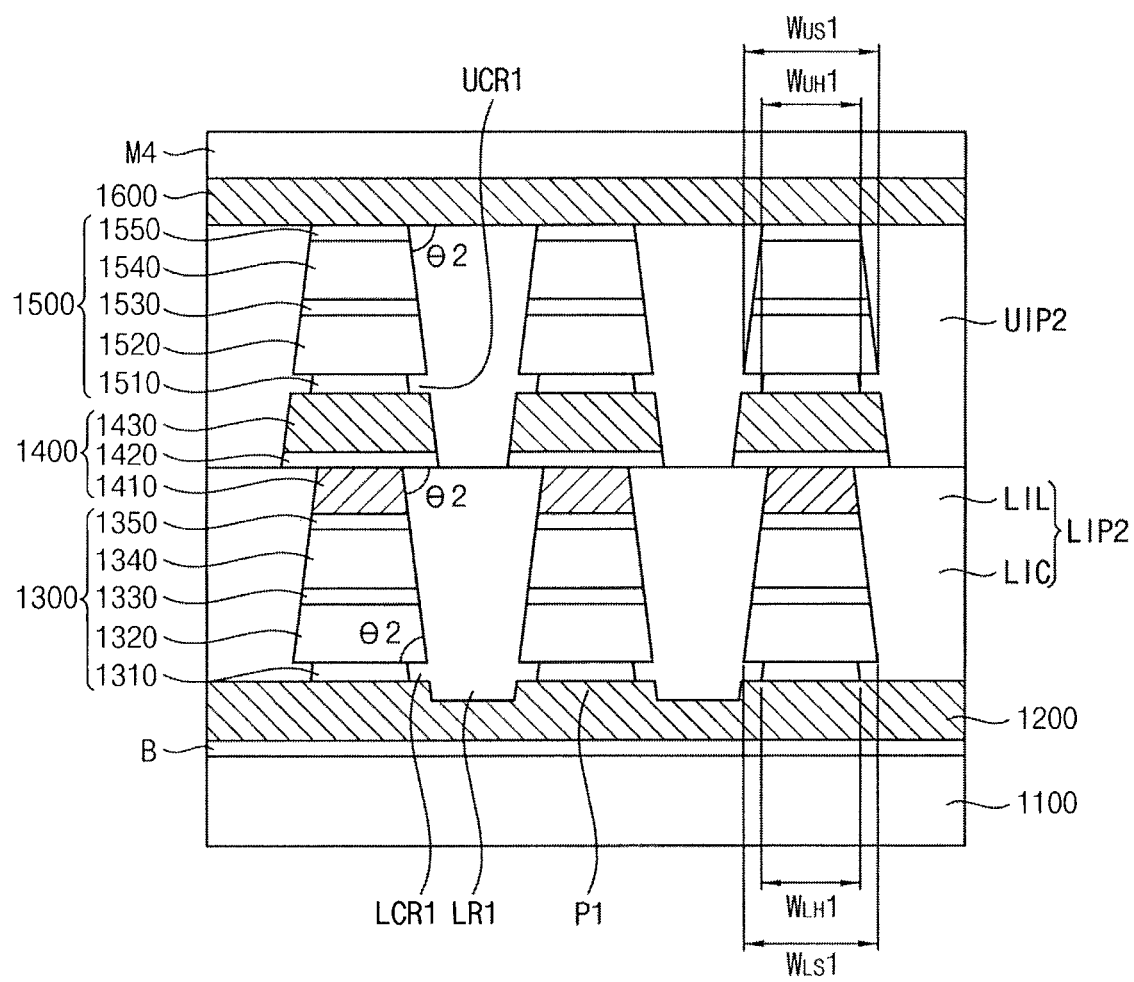
Figure 24B:
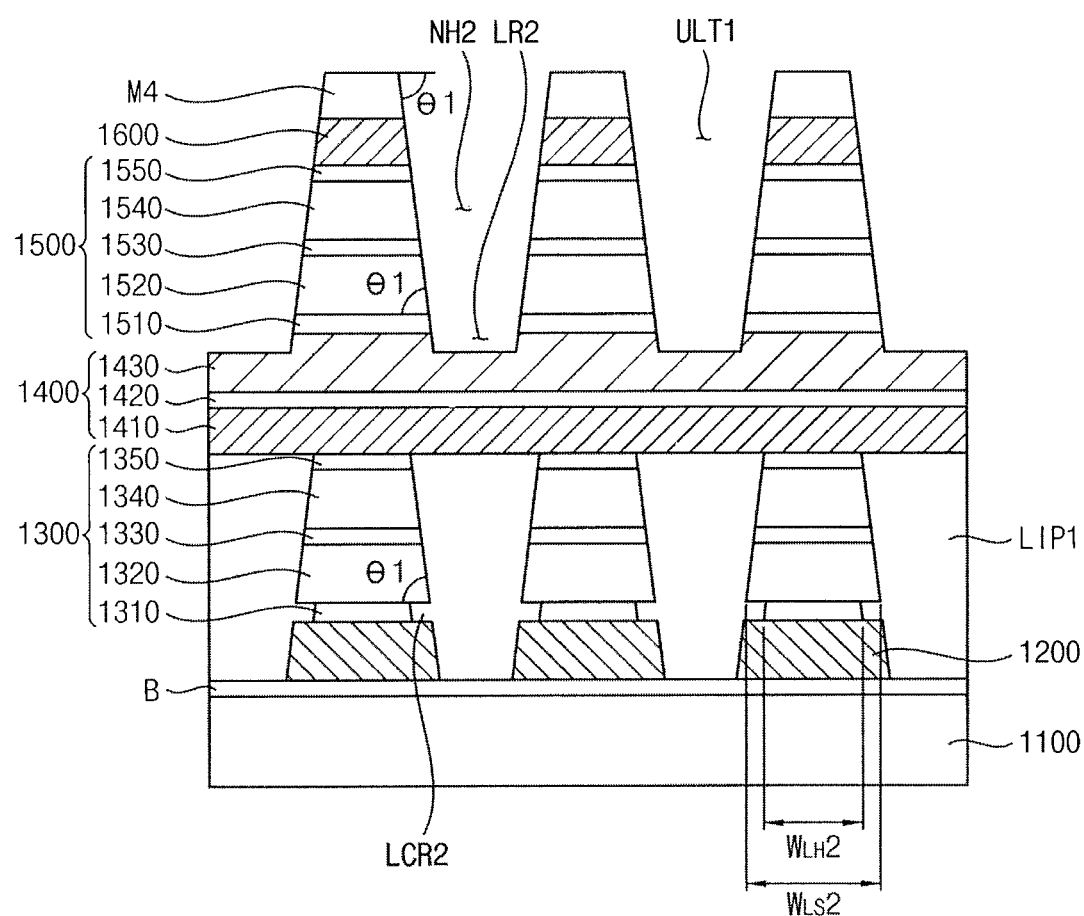

Referring to FIGS. 24A and 24B, the second cell line 1500b that may be exposed through the first upper line trench ULT1 may be partially removed, to thereby form a second node separation hole NH2 through which the second component line 1430 may be partially exposed. Thus, the second cell line 1500*b* may be node-separated into the second cell structures 1500 that may be positioned at each of the second cross points C2 of the upper conductive line 1600 and the second component line 1430.

Since the second cell line 1500*b* may include metal-based material similar to the upper conductive line 1600, the second cell line 1500*b* may be consecutively etched off after formation of the first upper line trench ULT1 and the upper conductive line 1600 just by changing the process conditions such as etching gases and a process temperature and pressure. In the above etching process, the process conditions may be individually adjusted to each of the first to third upper electrode lines 1510*b*, 1530*b* and 1550*b*, the second selection line 1520*b* and the second data storage line 1540*b* in such a way that the contact resistance therebetween may be reduced or minimized. Thus, the second cell line 1500*b* may be separated by the second node separation hole NH2 in the second direction y as well as be separated by the second upper insulation pattern UIP2 in the first direction x, so that the second cell line 1500*b* may be node-separated into a plurality of the second cell structures 1500.

That is, the second cell line 1500*b* may be formed into the second cell structure 1500 having a first upper electrode 1510, a second selection element 1520, a second upper electrode 1530, a second data storage element 1540 and a third upper element 1550 by the etching process for forming the second node separation hole NH2. In addition, an upper surface of the second component line 1430 may be exposed through the second node separation hole NH2.

For example, the second node separation hole NH2 and the first upper line trench UIT1 may be formed by a single etching process in the same etching chamber just by controlling the etching conditions.

The upper conductive layer and the second cell line 1500*b* may be partially etched off by an anisotropic etching process under the etching conditions that the first upper line trench ULT1 and the second node separation hole NH2 may be reduced downwards and side walls of the first upper line trench ULT1 and the second node separation hole NH2 may be continuously coplanar and slanted at the first slant angle θ1.

Accordingly, the upper conductive line 1600 and the second cell structure 1500 may be formed into a single trapezoid in such a way that the side surface of the second cell structure 1500 and the upper conductive line 1600 may be coplanar with each other in the same trapezoid.

For example, the first slant angle θ1 of the trapezoid may be in a range of about 70° to about 85° with respect to an upper surface of the upper conductive line 1600 like the second slant angle θ2, so that the trapezoid of the second cell structure 1500 and the upper conductive line 1600 may have a base angle of about 70° to about 85°.

In the present example embodiment, the first slant angle θ1 of the second cell trench CT2 may be substantially the same as the second slant angle θ2 of the second upper line trench ULT2 and the second node separation hole NH2. However, the first and the second slant angles θ1 and θ2 may be different from each other according to the requirements of the cross point cell array of the semiconductor memory device 2000.

In a modified example embodiment, the second component line 1430 exposed through the second node separation hole NH2 may be partially recessed, thereby forming a plurality of the second line recesses LR2 on the second component line 1430. Thus, the second component line 1430 may be formed into an uneven structure in which the second line recesses LR2 and second protrusions P2 may be alternately arranged at an upper portion thereof. The second protrusion P2 may be defined by the second recesses LR2 and the second cell structure 1500 may be arranged on the second protrusion P2.

The second component line 1430 may be partially removed by a dry or a wet etching process having an etching selectivity with respect to the second cell structure 1500.

Therefore, the thermal cross talk between the neighboring second cell structures 1500 on the second component line 1430 may be sufficiently reduced due to the depth of the second line recess LR2, thereby improving the operation reliability and stability of the semiconductor memory device 2000.

Figure 25A:
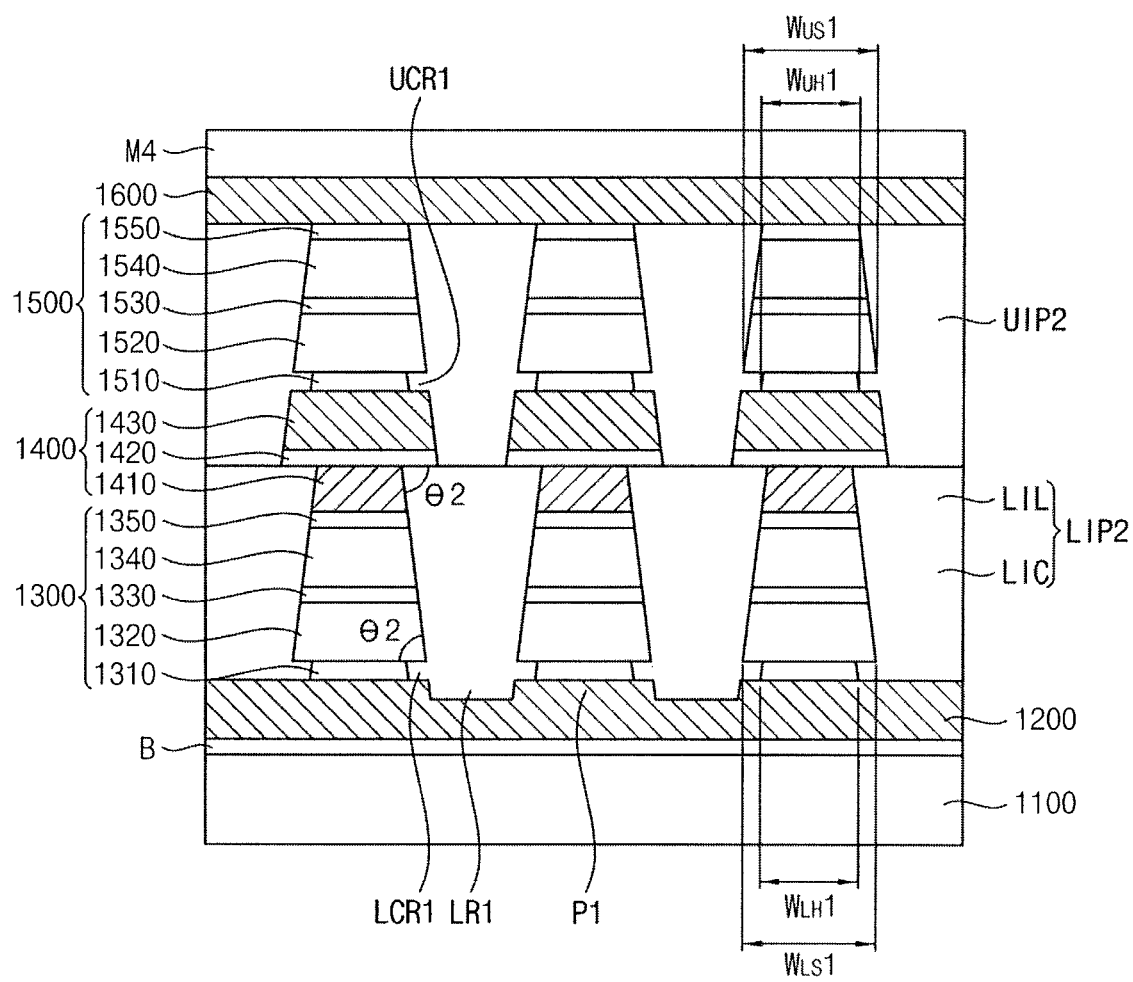
Figure 25B:
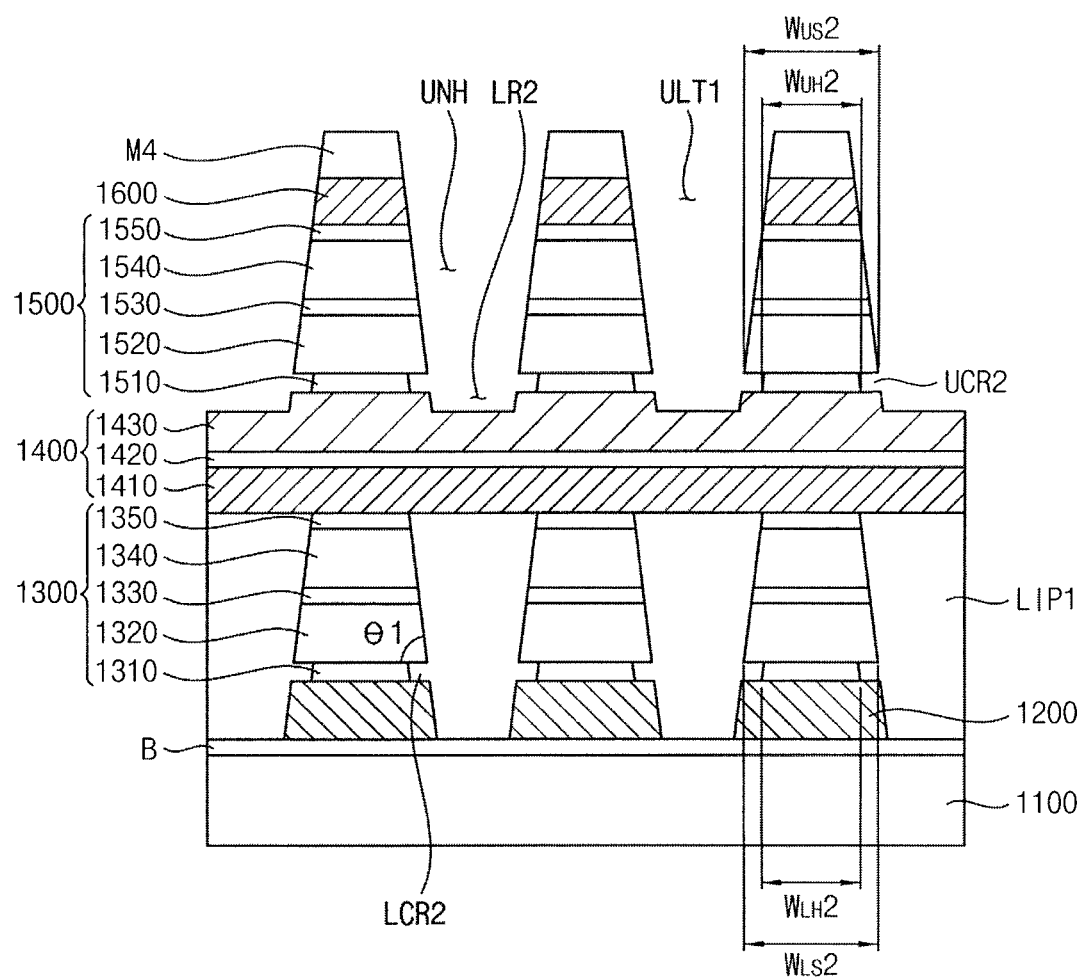

Referring to FIGS. 25A and 25B, the first upper electrode 1510 may be further etched off along the second direction y by an isotropic etching process, thus the width of the first upper electrode 1510 along the second direction y may be reduced to a second reduced width $W_{UH}2$ that may be smaller than a second width $W_{US}2$ of the second selection element 1520.

Accordingly, a second upper cell recess UCR2 may be formed between the second component line 1430 and the second selection element 1520 in such a way that the second upper cell recess UCR2 may be defined by the side surfaces of the first upper electrode 1510, the upper surface of the second component line 1430 and the lower surface of the second selection element 1520 and may communicate with the second node separation hole NH2. Therefore, the insulation space between the neighboring second cell structures 1500 may be enlarged as much as the size of the second upper cell recess UCR2.

In the present example embodiment, the second reduced width $W_{UH}2$ of the first upper electrode 1510 may be about ¼ to about ½ times the second width $W_{US}2$ of the second selection element 1520.

The isotropic etching process for forming the second upper cell recess UCR2 may be controlled in such a way that the first upper electrode 1510 may have a sufficient etching selectivity with respect to the second selection element 1520, the second upper electrode 1530, the second data storage element 1540, the third upper electrode 1550 and the second component line 1430.

The positions of the first and the second upper line recesses UCR1 and UCR2 may be varied according to the stack structure of the second cell structure 1500 similar to the modifications of the cell structure 300 as described in detail with reference to FIGS. 5A to 6B.

For example, when the second multilayer 1500*a* may be formed in such a way that the first upper electrode layer 1510*a* may be interposed between the second selection layer 1520*a* and the second data storage layer 1540*a*, the first and second upper cell recesses UCR1 and UCR2 may be defined by the second selection element 1520 and the second data storage element 1540.

In the same way, when the second multilayer 1500*a* may be formed in such a way that the third upper electrode layer 1550*a*, the second data storage layer 1540*a*, the second upper electrode layer 1530*a*, the second selection layer 1520*a* and the first upper electrode layer 1510*a* may be sequentially stacked on the second component layer 1430 and the first upper electrode layer 1510*a* may be interposed between the second selection layer 1520*a* and the upper conductive layer, the first and second upper cell recesses UCR1 and UCR2 may be defined by the second selection element 1520 and the upper conductive line 1600.

Figure 26A:
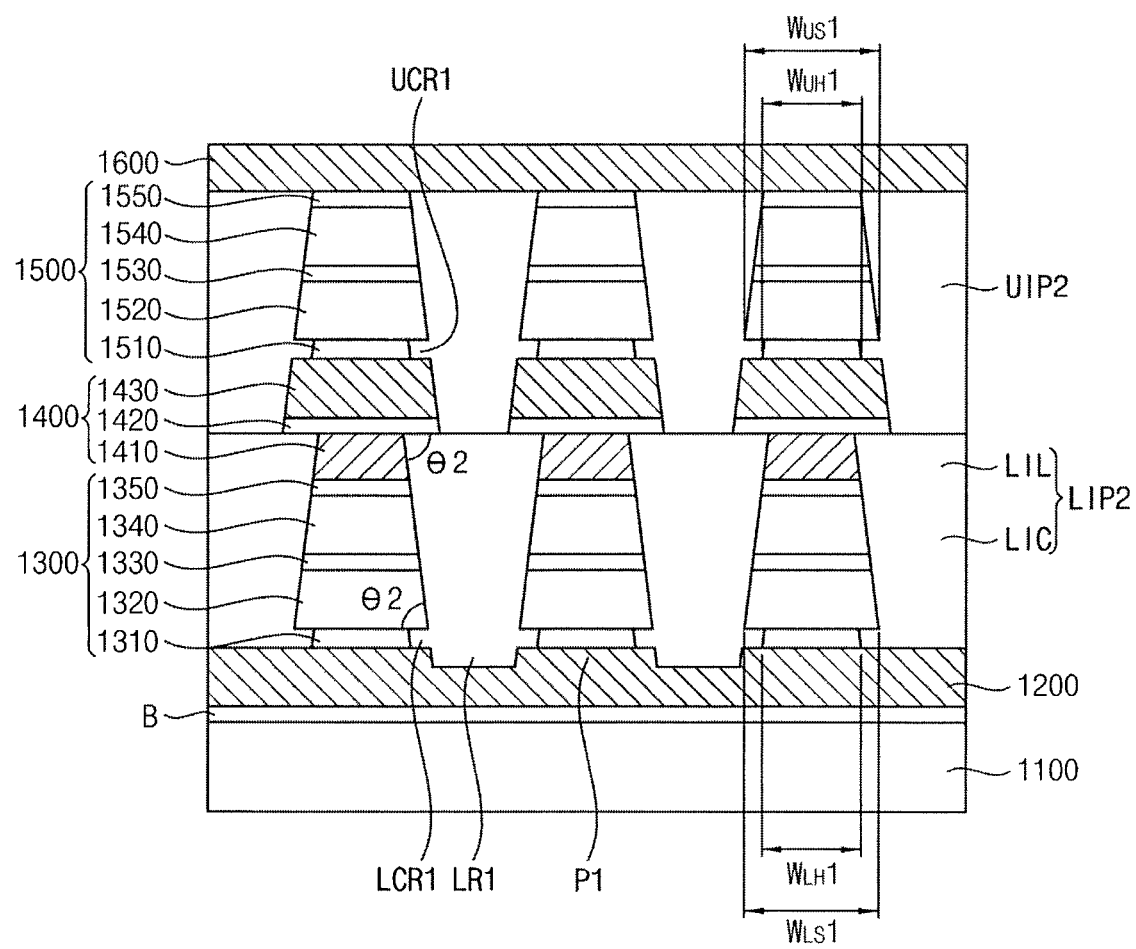
Figure 26B:
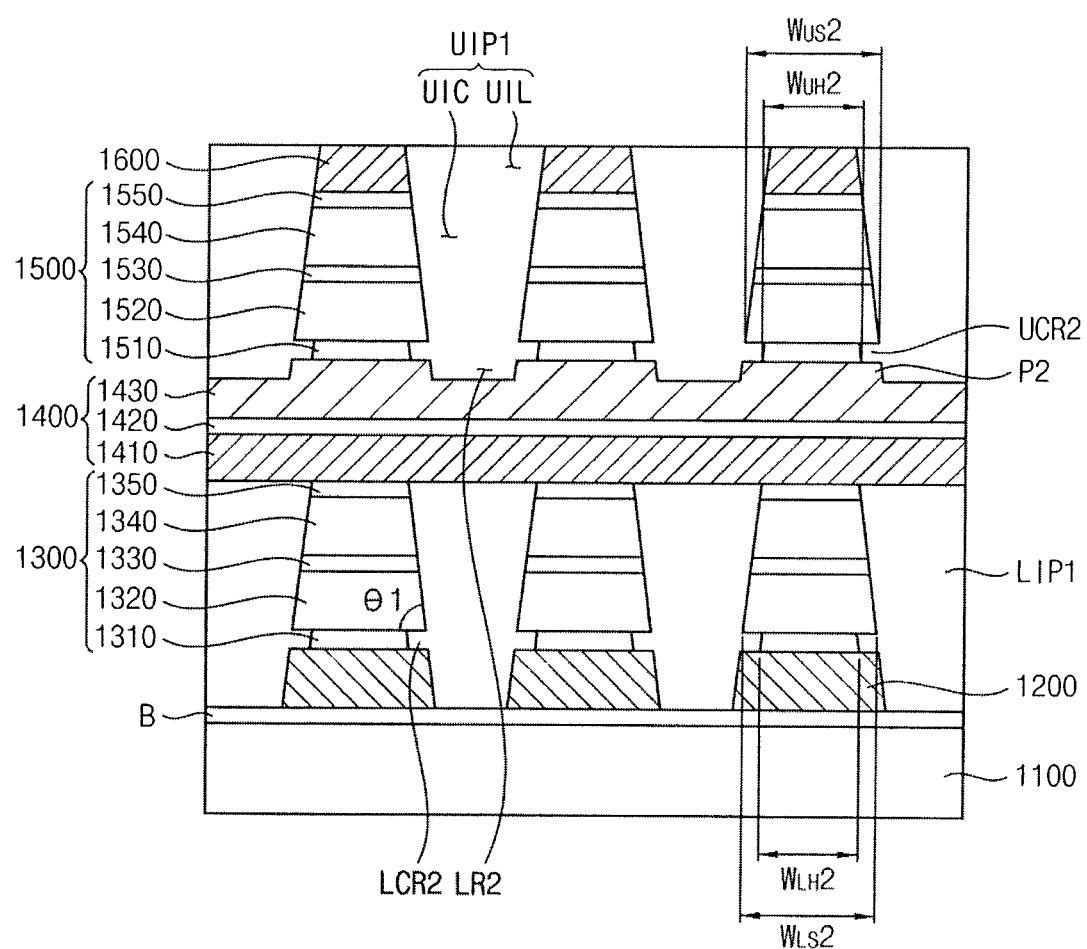

Referring to FIGS. 26A and 26B, an upper insulation column UIC for insulating the second cell structures 1500 may be formed in the second node separation hole NH2 and an upper insulation line UIL for separating the upper conductive lines 1600 may be formed in the first upper line trench ULT1, thereby forming a first upper insulation pattern UIP1.

For example, an insulation layer (not shown) may be formed to a sufficient thickness to fill up the first upper line trench ULT1 and the second node separation hole NH2 by a deposition process. Then, the insulation layer may be planarized by a planarization process until an upper surface of the upper conductive line 1600 may be exposed, thereby simultaneously forming the upper insulation column UIC and the upper insulation line UIL. The first upper insulation pattern UIP1 may include one of silicon oxide, silicon nitride and silicon oxynitride.

While the present example embodiment discloses that the upper insulation line UIL may include the same insulation materials as the upper insulation column UIC in the same process, the upper insulation column UIC and the upper insulation line UIL may be individually formed in different processes with different insulation materials.

The second cell structures 1500 on the second protrusions P2 may be separated by the upper insulation column UIC of which the bottom may be lower than a bottom surface of the second cell structure 1500. Thus, the thermal cross talk between neighboring memory cells of the second memory stack MC2 may be reduced, thereby increasing the operation reliability of the semiconductor memory device 2000.

According to the example embodiments of the semiconductor memory device and a method of manufacturing the same, the cross point cell array may be provided with the semiconductor memory device and each cell may include a cell structure having a heater electrode, a selector, e.g., an OTS, and a data storage element. The width of the heater may be decreased to be smaller than that of the selector, and the latitudinal cell recess may be provided in the cell structure, so the gap distances between neighboring cell structures may increase by as much as the cell recess and may enlarge an insulation space between the neighboring cell structures, thereby improving the insulation characteristics of the semiconductor memory device. Thus, the electrical interference between the neighboring cells may be sufficiently reduced in the semiconductor memory device. Particularly, when the cross point cell array of the semiconductor memory device is provided in a vertically stacked memory cells in a 3-dimensional structure, the breakdown voltage margin between a lower memory stack and an upper memory stack may be sufficiently reduced just by shaping the cell structures into a trapezoid.

The first bit line of the common bit line may be located at a top portion of the lower trapezoidal memory stack MC1 and the second bit line of the common bit line may be located at a bottom portion of the upper trapezoidal memory stack MC2. Thus, the width of the first bit line may be much smaller than that of the second bit line, and the cross gap Gc between the neighboring lower and upper memory stack MC1 and MC2 may increase as much as the width difference between the lower and upper bit lines, which may sufficiently improve the breakdown voltage margin between the neighboring lower and upper memory stacks. In addition, the gap distance between upper portions of the neighboring lower cell structures may increase due to the trapezoidal shape, thereby increasing the process margin for forming the upper cell structures.

Example embodiments provide a semiconductor memory device having a cross point array structure in which gap distances increases between neighboring cell structures, thereby improving insulation characteristics and threshold margin of the semiconductor memory device and a method of manufacturing the same. Accordingly, the insulation space is increased and the breakdown voltage margin is improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
   a substrate;
   a first conductive line disposed on the substrate and extending in a first direction;
   a first cell structure disposed on the first conductive line;
   a second conductive line disposed on the first cell structure and extending in a second direction that is different from the first direction;
   a second cell structure disposed on the second conductive line, a width of a lower portion of the second cell structure being greater than a width of an upper portion of the first cell structure; and
   a third conductive line disposed on the second cell structure and extending in the first direction,
   wherein a maximum width of the first conductive line is greater than a maximum width of the third conductive line.

2. The semiconductor device of claim 1, wherein a height of the second conductive line is greater than a height of the first conductive line, and greater than a height of the third conductive line.

3. The semiconductor device of claim 1, wherein the second conductive line includes a first portion and a second portion disposed on the first portion, and
   a width of a lower part of the second portion of the second conductive line is greater than a width of an upper part of the first portion of the second conductive line.

4. The semiconductor device of claim 1, wherein a width of a lower portion of the first cell structure is greater than a width of an upper portion of the second cell structure.

5. The semiconductor device of claim 1, wherein a width of a lower portion of the first cell structure is greater than a width of an upper portion of the first cell structure, and
   a width of a lower portion of the second cell structure is greater than a width of an upper portion of the second cell structure.

6. The semiconductor device of claim 1, wherein the second conductive line is a bit line, and
   each of the first conductive line and the third conductive line is a word line.

7. The semiconductor device of claim 1, wherein a sidewall of the first cell structure is inclined, and
a sidewall of the second cell structure is inclined.

8. The semiconductor device of claim 1, wherein a sidewall of the second conductive line is inclined.

9. A semiconductor device comprising:
a substrate;
a first conductive line disposed on the substrate and extending in a first direction;
a first cell structure disposed on the first conductive line;
a second conductive line disposed on the first cell structure and extending in a second direction that is different from the first direction;
a second cell structure disposed on the second conductive line; and
a third conductive line disposed on the second cell structure and extending in the first direction,
wherein the second conductive line includes a first portion and a second portion disposed on the first portion, the second portion of the second conductive line being between the second cell structure and the first portion of the second conductive line, and
wherein a width of a lower part of the second portion of the second conductive line is greater than a width of an upper part of the first portion of the second conductive line.

10. The semiconductor device of claim 9, wherein each of the first cell structure and the second cell structure includes a first electrode, a selection element disposed on the first electrode, a second electrode disposed on the selection element, a data storage element disposed on the second electrode, and a third electrode disposed on the data storage element.

11. The semiconductor device of claim 9, wherein a maximum width of the first conductive line is greater than a maximum width of the third conductive line.

12. The semiconductor device of claim 9, wherein a width of a lower portion of the first cell structure is greater than a width of an upper portion of the first cell structure, and greater than a width of an upper portion of the second cell structure, and
a width of a lower portion of the second cell structure is greater than the width of the upper portion of the first cell structure, and greater than the width of the upper portion of the second cell structure.

13. The semiconductor device of claim 9, wherein a height of the second conductive line is greater than a height of the first conductive line, and greater than a height of the third conductive line.

14. The semiconductor device of claim 9, wherein at least a portion of a sidewall of the second conductive line is inclined.

15. The semiconductor device of claim 9, further comprising a peripheral structure disposed between the substrate and the first conductive line, and including:
a gate structure disposed on an active region of the substrate;
a junction area disposed on the active region of the substrate and disposed around the gate structure;
an isolation layer disposed on the substrate and defining the junction area;
a contact plug contacting the junction area; and
a wiring structure contacting the contact plug.

16. A semiconductor device comprising:
a substrate;
a first conductive line disposed on the substrate and extending in a first direction;
a first cell structure disposed on the first conductive line;
a second conductive line disposed on the first cell structure and extending in a second direction that is different from the first direction;
a second cell structure disposed on the second conductive line; and
a third conductive line disposed on the second cell structure and extending in the first direction,
wherein a width of a lower portion of the first cell structure is greater than a width of an upper portion of the second cell structure,
a width of a lower portion of the second cell structure is greater than a width of an upper portion of the first cell structure, and
a height of the second conductive line is greater than a height of the first conductive line, and greater than a height of the third conductive line.

17. The semiconductor device of claim 16, wherein each of the first cell structure and the second cell structure is trapezoidal-shaped.

18. The semiconductor device of claim 16, wherein a minimum width of the first cell structure is greater than a minimum width of the second conductive line.

19. The semiconductor device of claim 16, wherein the second conductive line includes a first portion and a second portion disposed on the first portion, and a width of a lower part of the second portion of the second conductive line is greater than a width of an upper part of the first portion of the second conductive line.

20. The semiconductor device of claim 16, wherein a maximum width of the first conductive line is greater than a maximum width of the third conductive line.

* * * * *